United States Patent
Langhammer et al.

(10) Patent No.: US 7,024,446 B2
(45) Date of Patent: Apr. 4, 2006

(54) CIRCUITRY FOR ARITHMETICALLY ACCUMULATING A SUCCESSION OF ARITHMETIC VALUES

(75) Inventors: Martin Langhammer, Sandbanks (GB); Nitin Prasad, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 280 days.

(21) Appl. No.: 10/625,093

(22) Filed: Jul. 22, 2003

(65) Prior Publication Data

US 2004/0015528 A1    Jan. 22, 2004

Related U.S. Application Data

(62) Division of application No. 09/924,354, filed on Aug. 7, 2001, now Pat. No. 6,628,140.

(60) Provisional application No. 60/233,389, filed on Sep. 18, 2000.

(51) Int. Cl.
G06F 7/50 (2006.01)
(52) U.S. Cl. .................................. 708/700
(58) Field of Classification Search ............ 708/700, 708/706, 709, 627
See application file for complete search history.

(56) References Cited

U.S. PATENT DOCUMENTS

| | | | |
|---|---|---|---|
| 3,473,160 A | 10/1969 | Wahlstrom | 340/172.5 |
| 4,546,446 A * | 10/1985 | Machida | 708/627 |
| 4,871,930 A | 10/1989 | Wong et al. | 307/465 |
| 5,122,685 A | 6/1992 | Chan et al. | 307/465.1 |
| 5,128,559 A | 7/1992 | Steele | 307/465 |
| 5,333,120 A * | 7/1994 | Gilber't | 708/706 |
| 5,371,422 A | 12/1994 | Patel et al. | 326/41 |
| 5,483,178 A | 1/1996 | Costello et al. | 326/41 |
| 5,497,341 A * | 3/1996 | Cohen | 708/706 |
| 5,570,039 A | 10/1996 | Oswald et al. | 326/39 |
| 5,689,195 A | 11/1997 | Cliff et al. | 326/41 |
| 5,754,459 A | 5/1998 | Telikepalli | 364/759 |
| 5,825,202 A | 10/1998 | Tavana et al. | 326/39 |
| 5,874,834 A | 2/1999 | New | 326/39 |

(Continued)

FOREIGN PATENT DOCUMENTS

EP        0 461 798 A2    12/1991

(Continued)

OTHER PUBLICATIONS

"Implementing Multipliers in FLEX 10K EABs", *Altera*, Mar. 1996.

(Continued)

*Primary Examiner*—D. M. Malzahn
(74) *Attorney, Agent, or Firm*—Fish & Neave IP Group Ropes & Gray LLP; Jeffrey C. Aldridge

(57) ABSTRACT

A programmable logic integrated circuit device has at least one function-specific circuit block (e.g., a parallel multiplier, a parallel barrel shifter, a parallel arithmetic logic unit, etc.) in addition to the usual multiple regions of programmable logic and the usual programmable interconnection circuit resources. To reduce the impact of use of the function-specific block ("FSB") on the general purpose interconnection resources of the device, inputs and/or outputs of the FSB may be coupled relatively directly to a subset of the logic regions. In addition to conserving general purpose interconnect, resources of the logic regions to which the FSB are connected can be used by the FSB to reduce the amount of circuitry that must be dedicated to the FSB. If the FSB is a multiplier, additional features include facilitating accumulation of successive multiplier outputs (using either addition or subtraction and with sign extension if desired) and/or arithmetically combining the outputs of multiple multipliers.

5 Claims, 19 Drawing Sheets

U.S. PATENT DOCUMENTS

| | | | |
|---|---|---|---|
| 5,892,962 A | 4/1999 | Cloutier | |
| 5,999,015 A | 12/1999 | Cliff et al. | 326/39 |
| 6,069,487 A | 5/2000 | Lane et al. | 326/37 |
| 6,215,326 B1 | 4/2001 | Jefferson et al. | 326/41 |
| 6,343,306 B1* | 1/2002 | Lo | 708/700 |
| 6,407,576 B1 | 6/2002 | Ngai et al. | 326/41 |
| 6,538,470 B1 | 3/2003 | Langhammer et al. | 326/41 |
| 6,556,044 B1 | 4/2003 | Langhammer et al. | 326/40 |
| 2002/0089348 A1 | 7/2002 | Langhammer | 326/38 |

FOREIGN PATENT DOCUMENTS

| | | |
|---|---|---|
| EP | 0 905 906 A | 3/1999 |
| GB | 2 283 602 A | 5/1995 |
| WO | WO 98/38741 A | 9/1998 |
| WO | WO 99/56394 A | 11/1999 |

OTHER PUBLICATIONS

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

"Implementing Logic with the Embedded Array in FLEX 10K Devices", *Altera*, May 2001, ver. 2.1.

"The QuickDSP Design Guide", *Quicklogic*, Aug. 2001, revision B.

"QuickDSP™ Family Data Sheet", *Quicklogic*, Aug. 7, 2001, revision B.

J. Faura et al., "A Novel Mixed Signal Programmable Device With On-Chip Microprocessor," Custom Integrated Circuits Conference, 1997. Proceedings of the IEEE 1997 Santa Clara, CA, USA May 5-8, 1997, New York, NY, USA, IEEE, US, May 5, 1997, pp. 103-106.

* cited by examiner

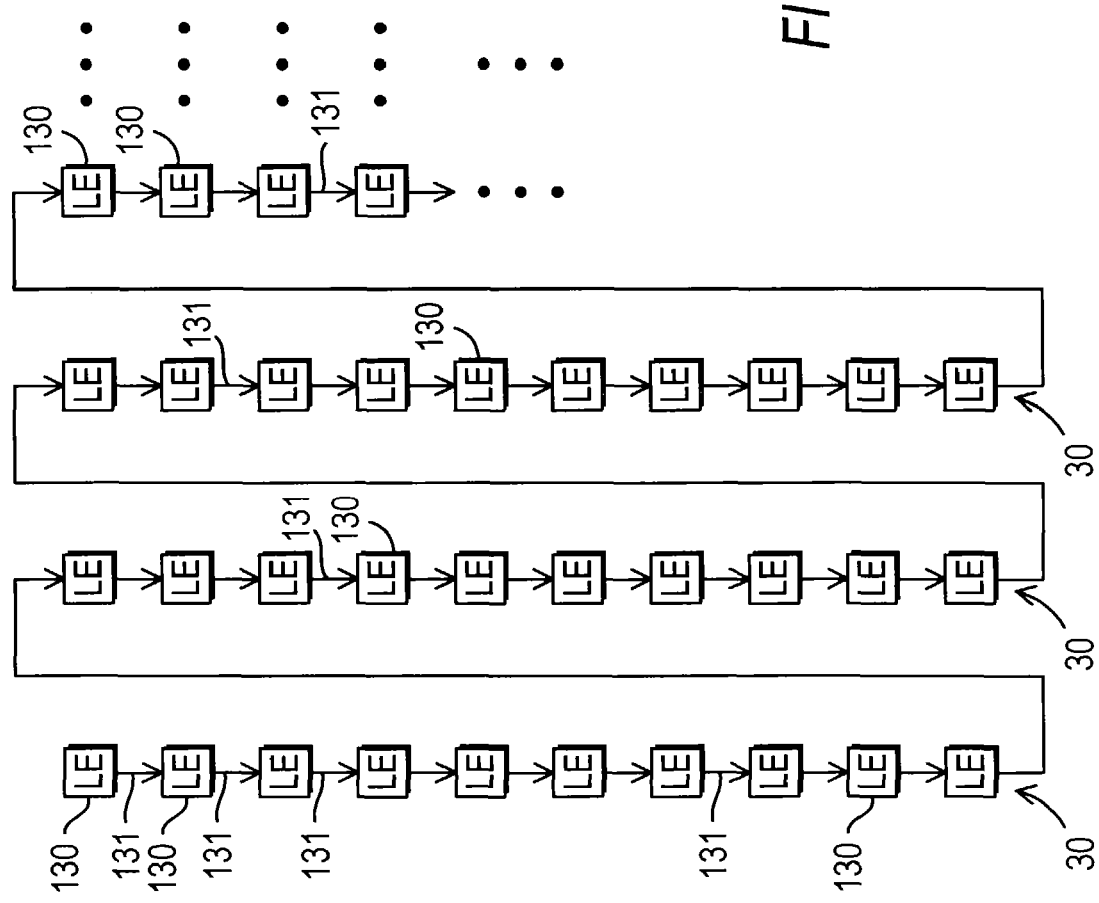

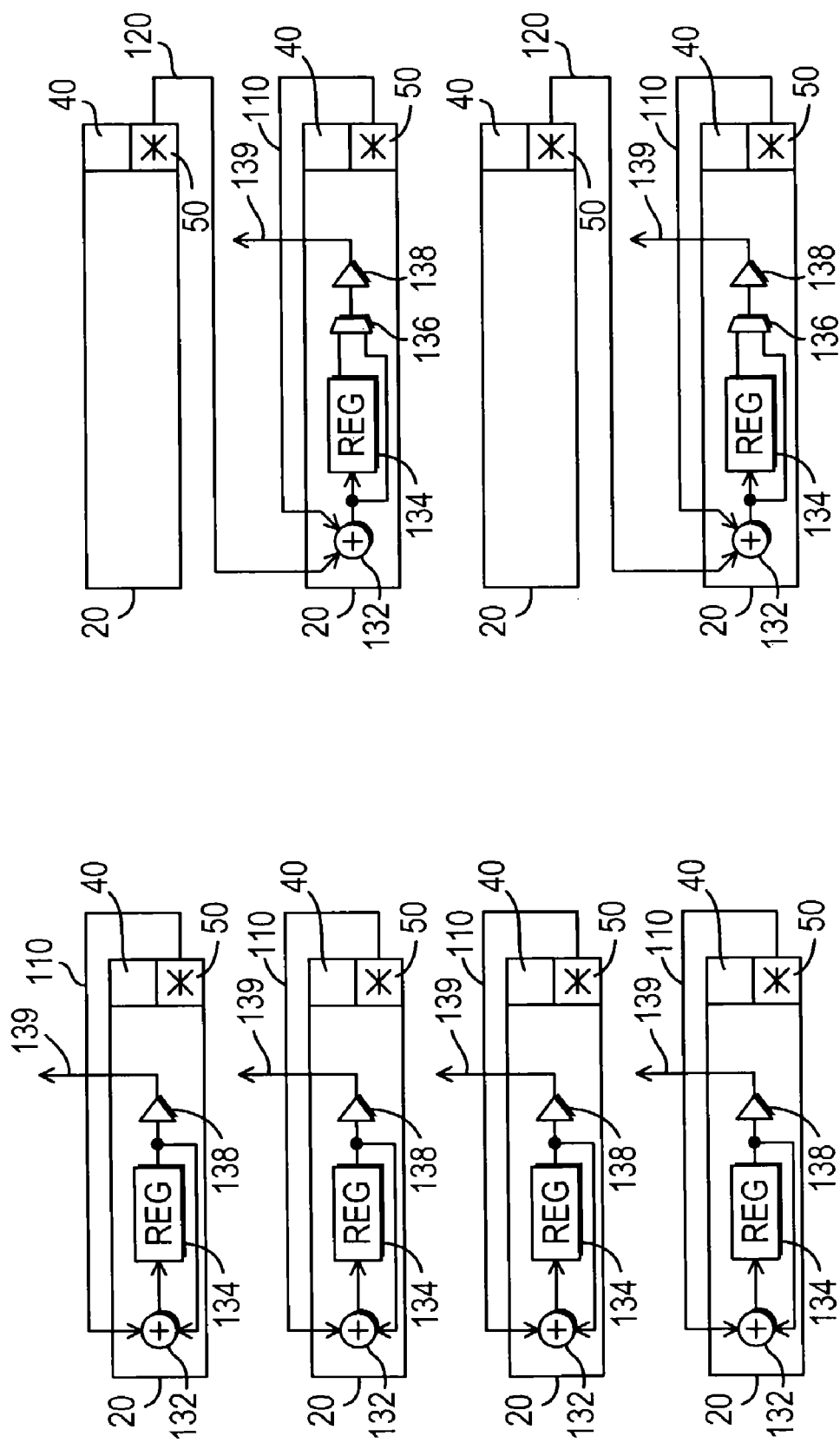

| TWO'S COMPLEMENT | |
|---|---|
| DECIMAL VALUE | TWO'S COMPLEMENT REPRESENTATION |
| ⋮ | ⋮ |
| +3 | · · · 0 0 0 0 1 1 |
| +2 | · · · 0 0 0 0 1 0 |
| +1 | · · · 0 0 0 0 0 1 |
| 0 | · · · 0 0 0 0 0 0 |
| -1 | · · · 1 1 1 1 1 1 |
| -2 | · · · 1 1 1 1 1 0 |
| -3 | · · · 1 1 1 1 0 1 |
| -4 | · · · 1 1 1 1 0 0 |
| ⋮ | ⋮ |

*FIG. 12*
(PRIOR ART)

| ONE'S COMPLEMENT | |
|---|---|
| DECIMAL VALUE | ONE'S COMPLEMENT REPRESENTATION |
| ⋮ | ⋮ |
| + 3 | · · · 0 0 0 0 1 1 |
| + 2 | · · · 0 0 0 0 1 0 |
| + 1 | · · · 0 0 0 0 0 1 |
| 0 | · · · 0 0 0 0 0 0 |
| - 1 | · · · 1 1 1 1 1 0 |
| - 2 | · · · 1 1 1 1 0 1 |
| - 3 | · · · 1 1 1 1 0 0 |
| - 4 | · · · 1 1 1 0 1 1 |
| ⋮ | ⋮ |

FIG. 13
(PRIOR ART)

CIRCUITRY FOR ARITHMETICALLY ACCUMULATING A SUCCESSION OF ARITHMETIC VALUES

This application is a divisional of U.S. nonprovisional patent application Ser. No. 09/924,354, filed Aug. 7, 2001 (now U.S. Pat. No. 6,628,140), which claims the benefit of U.S. provisional patent application No. 60/233,389, filed Sep. 18, 2000, each of which is hereby incorporated by reference herein in its entirety.

BACKGROUND OF THE INVENTION

This invention relates to programmable logic integrated circuit devices, and more particularly to function-specific blocks such as multipliers, arithmetic logic units, barrel shifters, and/or the like in programmable logic devices.

Programmable logic devices ("PLDs") are well known as is shown, for example, by Jefferson et al. U.S. Pat. No. 6,215,326 and Ngai et al. U.S. Pat. No. 6,407,576. PLDs typically include many regions of programmable logic that are interconnectable in any of many different ways by programmable interconnection resources. Each logic region is programmable to perform any of several logic functions on input signals applied to that region from the interconnection resources. As a result of the logic function(s) it performs, each logic region produces one or more output signals that are applied to the interconnection resources. The interconnection resources typically include drivers, interconnection conductors, and programmable switches for selectively making connections between various interconnection conductors. The interconnection resources can generally be used to connect any logic region output to any logic region input; although to avoid having to devote a disproportionately large fraction of the device to interconnection resources, it is usually the case that only a subset of all possible interconnections can be made in any given programmed configuration of the PLD. Indeed, this last point is very important in the design of PLDs because interconnection resources must always be somewhat limited in PLDs having large logic capacity, and interconnection arrangements must therefore be provided that are flexible, efficient, and of adequate capacity without displacing excessive amounts of other resources such as logic.

Although only logic regions are mentioned above, it should also be noted that many PLDs also now include regions of memory that can be used as random access memory ("RAM"), read-only memory ("ROM"), content addressable memory ("CAM"), product term ("p-term") logic, etc.

As the capacity and speed of PLDs has increased, there has been increasing interest in using them for signal or data processing tasks that may involve relatively large amounts of parallel information and that may require relatively complex manipulation, combination, and recombination of that information. Large numbers of signals in parallel consume a correspondingly large amount of interconnection resources; and each time that information (or another combination or recombination that includes that information) must be routed within the device, another similar large amount of the interconnection resources is consumed. Improved PLD architectures are needed to better address these issues.

SUMMARY OF THE INVENTION

A PLD in accordance with this invention includes a plurality of regions of programmable logic circuitry, general purpose interconnection circuitry that is programmably configurable to allow outputs of substantially any of the regions to be applied to inputs of substantially any of the regions, function-specific circuitry, and routing circuitry that is programmably configurable to route outputs of the function-specific circuitry to only a subset of the regions.

A function-specific block ("FSB") typically has a plurality of parallel inputs and a plurality of parallel outputs. An FSB is at least partly hard-wired to perform a particular task or tasks on its inputs to produce its outputs. The task(s) performed by an FSB may be wholly or partly, programmably or dynamically, selectable. Examples of FSBs include parallel multipliers, parallel arithmetic logic units ("ALUs"), barrel shifters, and the like.

In order to reduce the impact of including FSBs on the interconnection resources of the PLD, any or all of several techniques respecting the interconnection resources may be used in accordance with this invention. One technique is to derive inputs for the FSB from interconnection resources that are already fairly local (i.e., close) to the inputs of other resources such as logic regions (or memory regions if memory regions are included (although borrowing inputs from logic is presently preferred)). In this way the FSB effectively shares substantial amounts of input routing resources with those other (logic/memory/etc.) resources. A smaller fraction of the overall interconnection resources must be dedicated to providing FSB inputs, and the impact on use of the more global (as opposed to the local) interconnection resources is especially reduced. (Global interconnection resources include relatively long interconnection conductors, in contrast to the relatively short conductors that can be used for more local interconnections. Accordingly, it is "more expensive" to use a global interconnection conductor than a local interconnection conductor. Also, global interconnection conductors tend to be slow and to require drive by power-consuming drivers, whereas local conductors tend to be faster and may not require additional drivers.) Sharing an interconnection resource between an FSB input and another logic/memory/etc. resource input may reduce or even sacrifice the usability of the other resource when the PLD is configured to use the FSB, but that can be preferable to having to provide more interconnection resources that are dedicated to providing FSB inputs.

Another technique that can be used to reduce the impact of an FSB on the interconnection resources of a PLD is to use relatively local interconnection resources for the outputs of the FSB. These local resources can be used to supply the FSB outputs to the inputs (or other relatively local interconnection resources leading to the inputs) of particular subsets of other resources such as logic regions on the PLD. This avoids the need for drivers and/or more global interconnection conductors dedicated to the FSB outputs. If FSB output driving by drivers is needed, the output drivers of the immediately above-mentioned logic regions can be used. Similarly, if the FSB outputs need registering, the registers of these logic regions can be used. And these logic regions can even be used to at least begin further logical and/or arithmetic manipulation of the FSB outputs. Once again, this effective sharing of certain FSB output functions with logic regions may reduce or sacrifice the usefulness of those logic regions for other purposes when the FSB is being used, but that can be preferable to having to provide more dedicated interconnection resources to support the FSB.

Other aspects of the invention may be used to facilitate providing arithmetic accumulation of successive FSB (especially multiplier) outputs (using either addition or subtraction), addition or other logical combination of multiple concurrent FSB (especially multiplier) outputs, sign extension of FSB (especially multiplier) outputs, registration of FSB inputs and/or outputs, etc.

Further features of the invention, its nature and various advantages will be more apparent from the accompanying drawings and the following detailed description.

BRIEF DESCRIPTION OF THE DRAWINGS

FIG. 1A is a more detailed but still simplified schematic block diagram illustrating a particular feature of the FIG. 1 device.

FIG. 4 is a simplified schematic block diagram showing still another illustrative use of portions of the FIG. 1 circuitry in accordance with the invention.

FIG. 5 is a simplified schematic block diagram showing yet another illustrative use of portions of the FIG. 1 circuitry in accordance with the invention.

FIG. 12 is a table illustrating a conventional binary coding scheme that may be used in certain aspects of the invention.

FIG. 13 is a table illustrating another conventional binary coding scheme that may be used in certain aspects of the invention.

DETAILED DESCRIPTION

The invention will be at least initially described with greatest emphasis on inclusion of parallel multipliers in PLDs, but other examples of FSBs will also be mentioned and described, and from the overall disclosure it will be apparent to those skilled in the art how the invention can be applied to any of many different types and constructions of FSBs.

Figure 1:
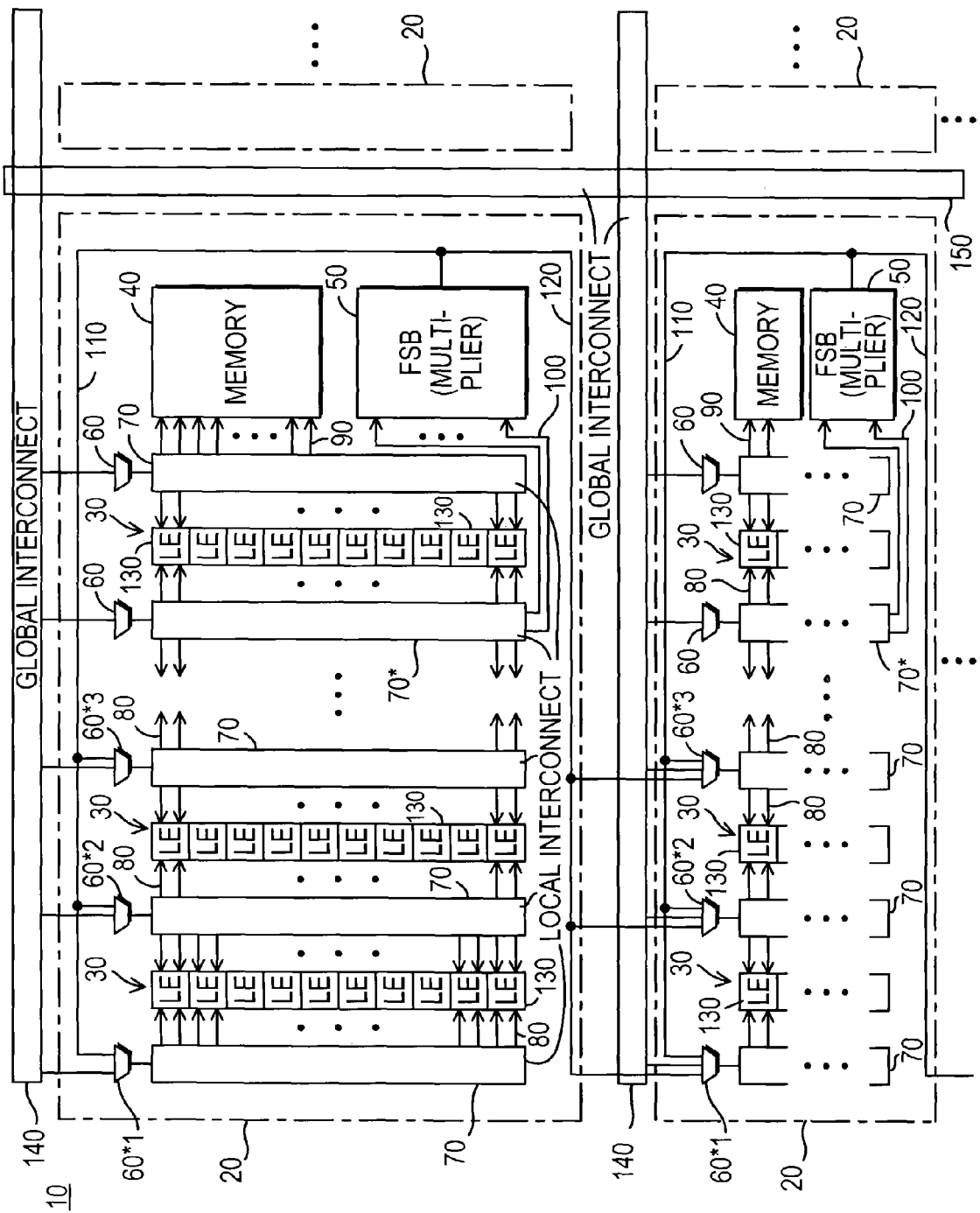
FIG. 1 is a simplified schematic block diagram of representative portions of an illustrative embodiment of a programmable logic device constructed in accordance with the invention.

The illustrative PLD 10 shown in FIG. 1 includes a two-dimensional array of intersecting rows and columns of "super-regions" 20 of programmable logic and other resources. Each super-region 20 includes a plurality of "regions" 30 of programmable logic, a region 40 of memory, and an FSB 50, which in this example is dedicated (i.e., at least partly hard-wired) parallel multiplier circuitry. Each super-region 20 also includes some relatively local interconnection resources such as programmable logic connectors ("PLCs") 60, the regions of interconnection conductors and PLCs labeled 70, logic-element-feeding conductors 80, memory-region-feeding conductors 90, and other conductors 100, 110, 120, etc. (Throughout the accompanying drawings many elements that are actually provided in multiple instances are represented by just single lines or other single schematic symbols. Thus, for example, each PLC 60 in FIG. 1 is actually representative of many instances of such PLC circuitry. As another example, each line 110 in FIG. 1 is actually representative of many parallel conductors 110.)

Each region 30 includes a plurality of "logic elements" 130. Each logic element (or "logic module" or "subregion") 130 is an area of programmable logic that is programmable to perform any of several logic tasks on signals applied to the logic element to produce one or more logic element output signals. For example, each logic element 130 may be programmable to perform one place of binary addition on two input bits and a carry-in bit to produce a sum-out bit and a carry-out bit. Each logic element 130 also preferably includes register (flip-flop) circuitry for selectively registering a logic signal within the logic element.

Conductors 80 apply what may be thought of as the primary inputs to each logic element 130 (although logic elements may also have other inputs). The outputs of logic elements 130 are not shown in FIG. 1 to avoid over-crowding the drawing. However, those outputs typically go to local interconnect resources 70 and other more general-purpose interconnection resources such as the global interconnect 140 associated with the row of super-regions 20 from which that logic element output came. There may also be another level of horizontal, general purpose interconnect associated with each super-region 20 that is not shown in FIG. 1 (again to avoid over-crowding the drawing). This would include conductors that extend across the super-region and that are usable for conveying signals between the regions 30 and 40 in that super-region. The output signals of the logic elements 130 in each super-region 20 are also typically applied to that level of interconnect, and that level of interconnect also typically provides additional inputs to PLCs 60.

PLCs 60 (of which there are many for each local interconnect region 70) are programmable (e.g., by associated function control elements ("FCEs")) to select any of their inputs for output to the associated local interconnect 70. Each local interconnect 70 is programmable (again by FCEs) to route the signals it receives to the adjacent logic elements 130 or memory region 40, or in certain cases to FSB 50.

Vertical global interconnection resources 150 are provided for making general purpose interconnections between the rows of super-regions 20.

Terms like "super-region", "region", and "logic element" or the like are used herein only as relative terms to indicate that relatively small elements may be grouped together in larger elements or units. These terms are not intended to always refer to circuitry of any absolute or fixed size or capacity. And indeed, if a hierarchy of relative sizes is not relevant in a particular context, these various terms may be used interchangeably or as essentially generic to one another. For example, in the above Background section the term "region" is used in this generic way.

Additional consideration of the term "PLC" is also appropriate at this point. Although thus-far described as-being programmably (and therefore statically or relatively statically) controlled (e.g., by FCEs), it will be understood that some or all elements referred to herein as PLCs may be alternatively controlled in other ways. For example, a PLC may be controlled by a more dynamic control signal (e.g., a logic signal on PLD 10 that can have different logic levels at different times during the post-configuration, "normal" logic operation of the PLD). Although such dynamic control of a PLC may mean that the PLC is not, strictly speaking, a "programmable" logic connector, nevertheless the term "PLC" will continue to be used as a generic term for all such generally similar elements, whether statically or dynamically controlled.

Continuing now with the discussion of FIG. 1, each FSB 50 may be a 16 bit by 16 bit parallel multiplier circuit (i.e., a circuit capable of arithmetically multiplying together two parallel 16-bit inputs to produce a parallel 32-bit product output). (Although 16×16 parallel multipliers are often referred to in the specific illustrative embodiments discussed herein, it will be understood that parallel multipliers of any other sizes can be used instead if desired. In general, these multipliers can have size(s) n×m, where n and m are any desired integers that are either the same as or different from one another.) Assuming that each FSB 50 is a 16×16 parallel multiplier, each FSB needs two 16-bit input buses and a 32-bit output bus. This could take up a substantial amount of interconnection resources on PLD 10 if such resources were to be dedicated to supporting FSBs 50.

To avoid having to dedicate such a large amount of interconnection resources to FSBs 50, each FSB 50 is arranged to get its 32 inputs from one (or more) of the regions of local interconnect 70 that are already provided to supply inputs to adjacent logic regions 30. In the particular example shown in FIG. 1, the local interconnect region 70 that is located one such region 70 away from the region immediately adjacent to an FSB 50 in the same super-region 20 is chosen for this purpose. This local interconnect region (identified as 70* for ease of reference) is chosen because it is not used by memory region 40 but is relatively close to the FSB 50. Conductors 100 (32 in number) are provided from local interconnect region 70* to the associated FSB 50. When an FSB 50 is being used, these conductors 100 supply the two numbers to be multiplied (up to 16 bits each) to the FSB. Thus when an FSB 50 is being used, it effectively "steals" some of the local routing provided for logic region input.

The output signals of each FSB 50 (i.e., up to 32 bits of multiplier product signals) are conveyed on dedicated conductors 110 to selected PLCs 60 in the same super-region 20 that includes that FSB. For ease of reference these PLCs are identified by reference numbers 60*1, 60*2, 60*3, etc. (generically 60*). The output signals of each FSB 50 are also conveyed on dedicated conductors 120 to those same PLCs 60* in the vertically downwardly adjacent super-region 20. Thus the outputs of each FSB 50 are at least initially conveyed on dedicated but relatively local conductors 110 and 120. The FSB 50 outputs therefore do not (at least initially) consume any of the more general-purpose routing and do not require dedicated drivers. This saves on power and device size. In addition, this (at least initial) dedicated output routing for FSBs 50 reduces the potential for congestion in the general purpose routing, and (as will be shown in detail below) it facilitates adding together or otherwise combining multiplier outputs.

The PLCs 60* selected to receive FSB 50 outputs in each super-region 20 preferably have the following characteristics: (1) they serve logic elements 130 that are adjacent to one another in an arithmetic carry chain that extends from logic element to logic element, and (2) they allow the outputs of two FSBs 50 to be applied to the same logic elements 130 in pairs of bits (one bit of the same order of magnitude from each of the two FSBs), with each bit pair being applied to one logic element and with the orders of magnitude of the pairs being in the same progression as the progression of orders of magnitude in the arithmetic carry chain serving those logic elements. In this way, the outputs of two vertically adjacent FSBs 50 can be added together by the logic elements 130 receiving those FSB outputs. The circuitry shown in FIG. 1 is therefore capable of operating as a multiplier-adder that makes relatively little use of the general purpose interconnection resources of PLD 10, at least for its internal operations. In addition to the foregoing, the registers of the logic elements 130 that perform the above-described addition can be used to store the result of that addition, if desired. The output drivers of the logic elements 130 that perform the above-described addition can be used to drive the result of that addition out into the general purpose routing (interconnection resources) of device 10, if desired.

If the outputs of two FSBs 50 are not combined as described immediately above, then the circuitry shown in FIG. 1 permits other possible uses. For example, the outputs of an FSB 50 can be applied to logic elements 130 in the same super-region 20 via the associated conductors 110 and PLCs 60* (or in the downwardly adjacent super-region 20 via the associated conductors 120 and the PLCs 60* in that downwardly adjacent super-region). The output drivers of the receiving logic elements 130 can be used to drive the FSB 50 output signals out into the general purpose interconnect of PLD 10, with or without intervening registration of those signals by the registers of those logic elements. The circuitry of and associated with the receiving logic elements 130 can be used to provide multiplier-accumulator ("MAC") operation, wherein each successive FSB 50 output is arithmetically added (including subtraction as a possible alternative) to the contents of the registers of the receiving logic elements. Local feedback from the logic element register outputs to logic element inputs, and the arithmetic capabilities of the logic elements (including the above-mentioned carry chain features) are used in this accumulation function. The output drivers of the receiving logic element 130 are usable to drive the MAC output signals out into the general purpose interconnect. Again, very little general purpose interconnect is required to provide the above-described MAC functions, especially to support the operations that are internal to such a MAC function.

From the foregoing it will be appreciated that the organization of the circuitry shown in FIG. 1 avoids the need to dedicate either output registers or output drivers to FSB 50. In applications in which the outputs of an FSB 50 require registration and/or driving out into the general purpose interconnect of PLD 10, those capabilities can be provided by the registers and/or output drivers of the logic elements to which the FSB outputs are locally conveyed.

It will be appreciated that sharing of local interconnect resources 70* between adjacent logic regions 30 and FSB 50 may at least somewhat sacrifice the usability of those logic regions when PLD 10 is programmed to use FSB 50. It is believed, however, that this is more than offset by the avoidance of having to provide input routing that is dedicated to FSB 50. FSB 50 could alternatively share input routing with the associated memory region 40, but it is believed preferable to share with logic regions 30 (e.g., because there are generally more logic regions than memory regions). As another possible alternative, each FSB 50 could get its inputs from more than one nearby region 70 of local interconnect. This might make it possible for use of an FSB 50 to less significantly impact the usability of the logic regions 30 also served by those regions 70 because less of the resources of each such region 70 would have to be turned over to the FSB. On the other hand, such an approach might mean that even more of the logic of PLD 10 would be impacted by the use of an FSB, and that might be less desirable than a greater impact on a smaller amount of the logic.

On the output side, use of the output drivers of the logic elements 130 that receive the outputs of an FSB 50 to drive the FSB outputs (or signals based on those outputs) out into the general purpose interconnect of PLD 10 saves having to provide separate output drivers that are dedicated to the FSB outputs. This is a significant saving in an expensive and power-consuming resource (i.e., drivers). On the other hand, it may mean that the usability of other resources of the logic elements that receive the FSB 50 outputs is at least partly sacrificed when the FSB is being used. But another benefit of this approach is the ability to use those other logic element resources to effectively extend FSB 50 functionality to MAC or multiplier-adder operation or to any other similar task or tasks, if desired.

One of the points made above should perhaps be further amplified. Because each FSB 50 can produce as many 32 parallel outputs, 32 adjacent logic elements 130 in the super-regions 20 that can make use of those signals are enabled to receive those signals in order of magnitude order. In the example shown in FIG. 1, these 32 logic elements in a typical super-region 20 are the ten in the left-most region 30, the ten in the second-from-left-most region 30, the ten in the third-from-left-most region 30, and the top two in the fourth-from-left-most region 30. (Constructing PLD 10 with ten logic elements 130 per region 30 is only illustrative, and constructing regions 30 with any other number of logic elements 130 (e.g., more than ten or less than ten (even as few as one or two)) is also possible. It will be readily apparent how distribution of the outputs of FSBs 50 can be changed to accommodate different numbers of logic elements 130 in regions 30.) It is assumed in this discussion that the carry chain is constructed as shown by the carry leads 131 in FIG. 1A, and that it therefore starts with the upper-left-most logic element 130, goes from logic element to logic element down the left-most region 30, then goes up to the top of the second-from-left-most region 30, down that region, and so on. Thus the ten least significant output bits of an FSB 50 are applied to the left-most groups of PLCs **60*1 in the appropriate super-regions 20; the ten next more significant outputs of the FSB are applied to the second-from-left-most groups of PLCs 60*2 in the appropriate super-regions 20; the ten next more significant outputs of the FSB are applied to the third-from-left-most groups of PLCs 60*3 in the appropriate super-regions 20; and the two most significant outputs of the FSB are applied to the fourth-from-left-most groups of PLCs 60*4 in the appropriate super-regions 20**.

From PLCs **60*1, the ten least significant FSB 50 output bits can be programmably routed (via the associated local interconnect 70) into the ten logic elements 130 in the left-most regions 30 in order of the significance of those bits (i.e., least significant bit going to the top-most logic element 130 (which is at the least significant position in the carry chain); next-more-significant bit going to the next-to-top-most logic element 130 (which is at the next more significant position in the carry chain); and so on). From PLCs 60*2, the ten next more significant FSB 50 output bits can be programmably routed (via the associated local interconnect 70) to the ten logic elements 130 in the second-from-left-most regions 30, again in order of the significance of those bits so as to continue to match the progression of significance in the carry chain. The same applies for the outputs of PLCs 60*3 and 60*4. In this way the FSB 50** outputs are preferably routed into the logic in a way that facilitates use of the receiving logic to arithmetically further process the FSB outputs.

It should also be pointed out that deriving the inputs for an FSB 50 from a region of local interconnect 70* that is already provided for use in routing signals to logic regions 30 gives the FSB the benefit of flexible input routing because such flexible routing is typically an attribute of local interconnect 70. Also, as has already been at least suggested, deriving inputs for an FSB 50 from local interconnect 70* that is associated with logic regions 30 rather than with a memory region 40 allows independent operation of the FSB and the memory region in each super-region 20.

Figure 2:
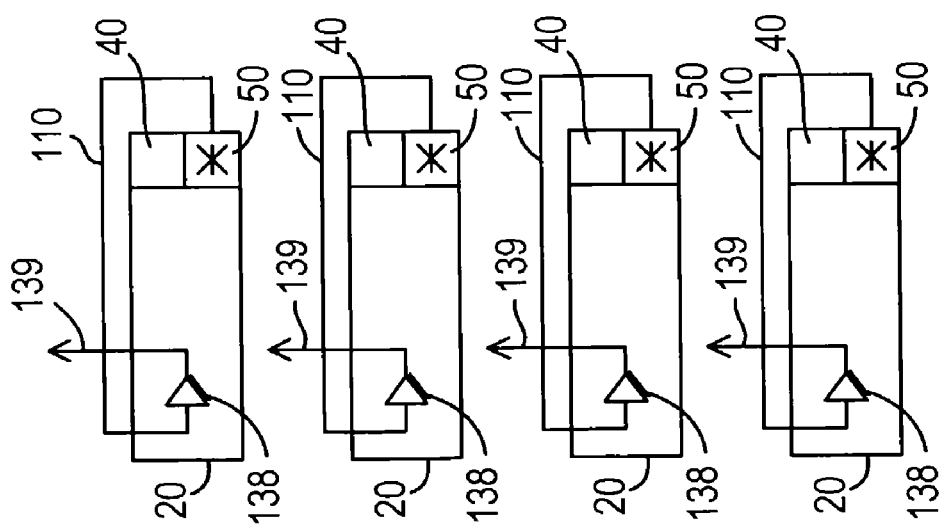
FIG. 2 is a simplified schematic block diagram showing an illustrative use of portions of the FIG. 1 circuitry in accordance with the invention

FIGS. 2–6 show several examples of ways in which circuitry of the type shown in FIG. 1 can be used. In FIG. 2 the FSB 50 in each super-region 20 is initially used by the other circuitry in that super-region. For example, the output drivers 138 in or associated with the logic elements 130 that receive FSB 50 outputs (in part via associated conductors 110) are used to drive the FSB output signals out via leads 139 into the general purpose interconnect of the PLD. Of course, the programmable logic of the logic elements 130 that receive the FSB 50 outputs may also be used to process the FSB output signals prior to driving the resulting signals out via elements 138 and 139, if desired.

Figure 3:
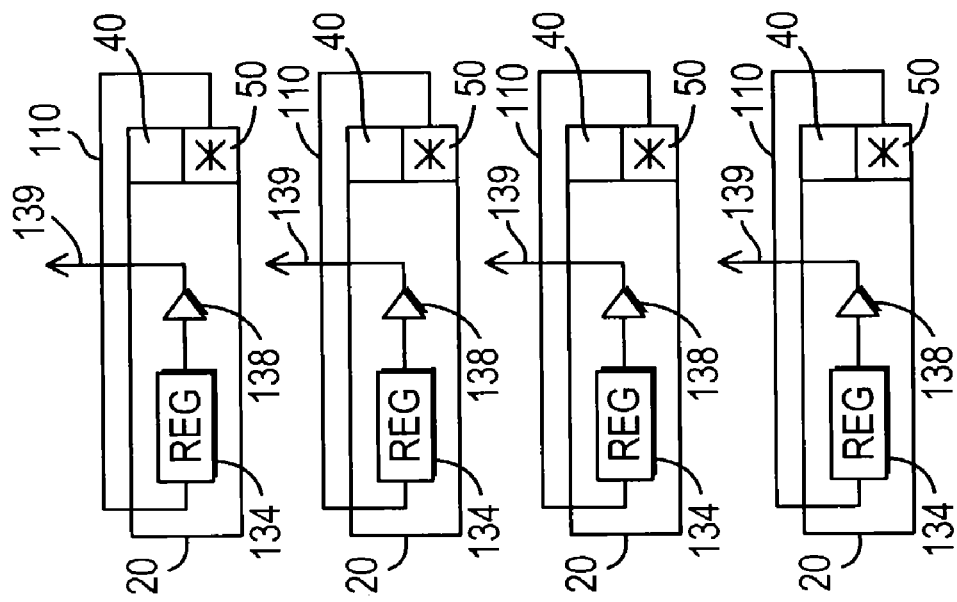
FIG. 3 is a simplified schematic block diagram showing another illustrative use of portions of the FIG. 1 circuitry in accordance with the invention.

FIG. 3 is similar to FIG. 2, except that it shows that the FSB 50 output signals can be registered by the registers 134 of the receiving logic elements 130 prior to driving the registered signals out via elements 138 and 139. Again, the logic of the receiving logic elements can also be used to process the FSB output signals prior to registration of the resulting signals by registers 134, if desired.

FIG. 4 is again generally similar to FIGS. 2 and 3, except that it shows use of the resources of the receiving logic elements 130 to perform an accumulation operation on the output signals of FSB 50 (e.g., to provide a multiplier-accumulator ("MAC") capability). The output signals of an FSB 50 are combined (i.e., added) in the programmable logic 132 of the receiving logic elements 130 with the outputs of the registers 134 of those logic elements to produce new values for storage by the registers. The register output signals are also available for driving out via elements 138 and 139.

FIG. 5 shows use of pairs of super-regions 20 to provide multiplier-adder capability. Considering, for example, the upper pair of super-regions 20, the output signals of the FSB 50 in the upper super-region are applied (in part via associated leads 120) to receiving logic elements 130 in the lower super-region. The output signals of the FSB 50 in the lower super-region in the upper pair are also applied (in part via associated leads 110) to those same receiving logic elements 130. The programmable logic 132 of the receiving logic elements is used to add these two FSB output signals, and the results may be output via elements 138 and 139, either with or without registration by registers 134. PLCs 136 in or associated with the receiving logic elements 130 are controllable to select whether registered or unregistered signals are output. The lower pair of super-regions 20 in FIG. 5 operates similarly to the upper pair.

Figure 6:
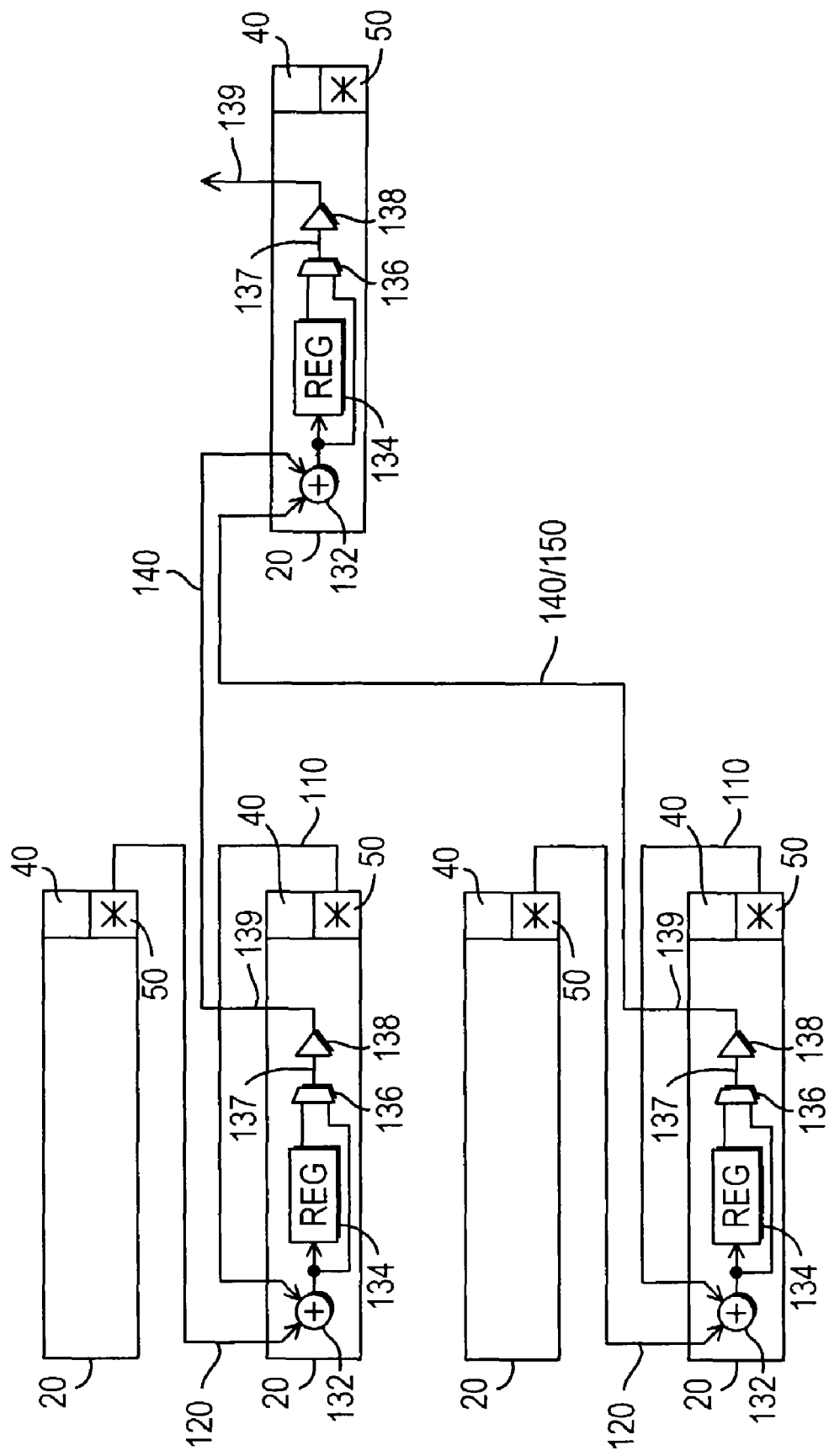
FIG. 6 is a simplified schematic block diagram showing still another illustrative use of portions of the FIG. 1 circuitry in accordance with the invention.

FIG. 6 is generally similar to FIG. 5 but shows the use of yet another super-region 20 (the one on the right in FIG. 6) to add the outputs of the two multiplier-adders on the left. General purpose interconnect 140/150 is used to route the outputs of the two multiplier accumulators on the left to receiving logic elements 130 in the super-region 20 on the right. The programmable logic 132 in those receiving logic elements is used to add together the signals from the two multiplier adders. The resulting signals can be output via elements 138 and 139 in the super-region 20 on the right, either with or without registration by the registers 134 in the logic elements performing the addition. PLCs 136 in the super-region 20 on the right determine whether the outputs are registered or unregistered.

Although FIG. 6 shows the final addition being performed in a fifth super-region 20 (on the right in FIG. 6), it will be understood that it could alternatively be performed in whole or in part in one or more of the super-regions 20 on the left in FIG. 6. For example, any one or more of these super-regions on the left may have sufficient resources left over from the first level of multiplication and addition to also perform the second level of addition.

It will be appreciated that FIGS. 2–6 are greatly simplified in that they tend to show only single circuit paths and single circuits that are merely representative of what are typically multiple (e.g., up to 32 in the FIG. 1 example) parallel circuit paths and circuits. FIGS. 2–6 are also only examples of the many ways that circuitry of the type shown in FIG. 1 can be configured (i.e., programmed) for use.

Figure 7:
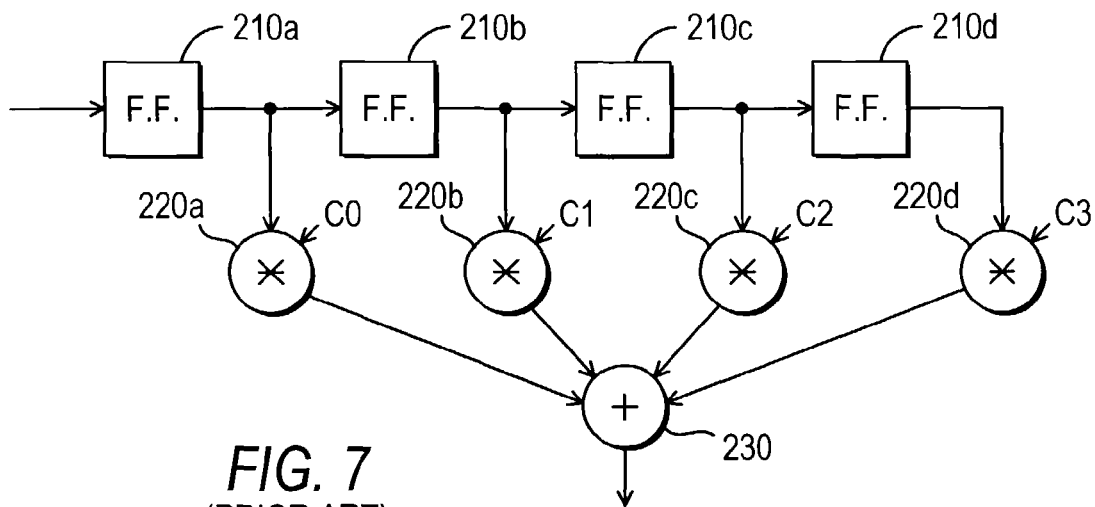
FIG. 7 is a simplified block diagram of prior art circuitry that can be readily implemented in circuitry of the type shown in FIG. 1 in accordance with the invention.

FIG. 7 shows an example of a frequently needed circuit function that is readily implemented in PLDs constructed as described above. FIG. 7 shows what is often referred to as a finite impulse response ("FIR") filter in a configuration sometimes called "direct form 2." FIR filters are very often needed in digital signal processing ("DSP"). Successive samples of data to be processed are shifted in parallel through parallel groups of flip-flops 210a–210d. Each successive parallel output of each flip-flop group 210 is multiplied by a respective one of parallel coefficients C0–C3 in a respective one of parallel multipliers 220a–220d. The concurrent parallel outputs of multipliers 220a–220d are added together in parallel adder 230 to produce a final output signal. It will be apparent that everything in FIG. 7 below shift registers 210 can be readily implemented in the circuitry shown in FIG. 6, which (as has been said) is one possible configuration and therefore use of circuitry of the type shown in FIG. 1. In circuitry of the type shown in FIG. 6 the addition represented by adder 230 in FIG. 7 is performed in three parts in the three adder logic circuitries 132.

Figure 8:
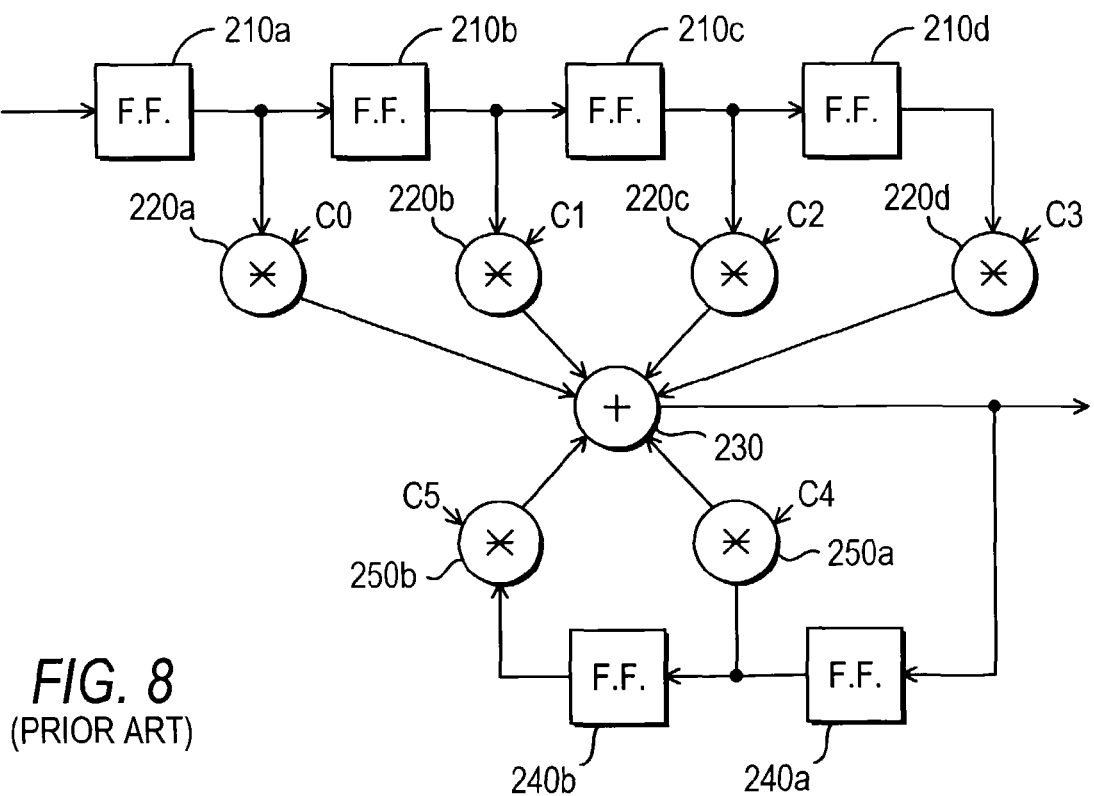
FIG. 8 is a simplified block diagram of other prior art circuitry that can be readily implemented in circuitry of the type shown in FIG. 1 in accordance with the invention.

Another example of circuitry frequently needed in digital signal processing ("DSP") is shown in FIG. 8. This is an example of an infinite impulse response ("IIR") filter. The upper part of this circuitry is similar to what is shown in FIG. 7. Additional inputs to adder 230 in FIG. 8 are adder 230 outputs delayed by flip-flops 240a and 240b and multiplied by additional coefficients C4 and C5 in parallel multipliers 250a and 250b. As in the case of FIG. 7, the upper multiplier and adder part of FIG. 8 can be implemented as shown in FIG. 6. The lower multiplier and adder part can be implemented in another pair of super-regions 20 like either pair on the left in FIG. 6. The final output can be produced in another super-region 20 like the one on the right in FIG. 6, which receives and adds the outputs of the above-mentioned additional pair of super-regions and the outputs of the super-region on the right in FIG. 6.

The ease with which circuitry of the type shown in FIG. 1 can be configured to implement functions of the type shown in FIGS. 7 and 8 demonstrates the usefulness and therefore importance of FIG. 1 type circuitry.

Figure 9:
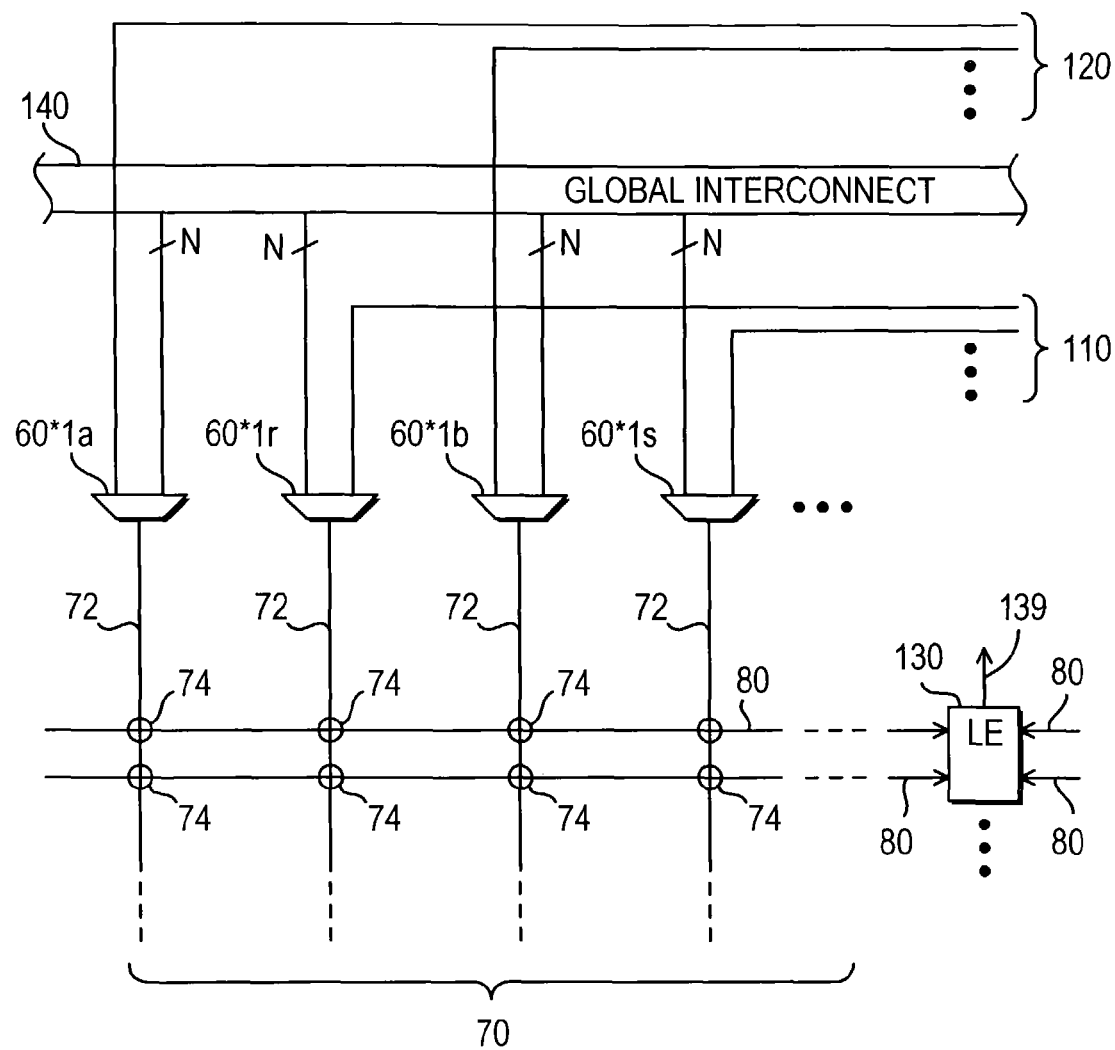
FIG. 9 is a simplified schematic block diagram showing a representative portion of a particular aspect of the FIG. 1 circuitry in more detail.

FIG. 9 shows that relatively little needs to be added to interconnection resources 60/70 to add multiplier outputs 110/120 to the signals available as inputs to logic elements 130. Each PLC 60\* that will receive a multiplier output 110 or 120 already typically receives multiple ("N") inputs from the general purpose interconnect such as the associated global interconnection resources 140. (In FIG. 9 what was previously represented by a single element identified by reference number **60\*1 is shown more completely as multiple, separate PLCs 60\*1a, 60\*1r, 60\*1b, 60\*1s**, etc.)

In the depicted illustrative architecture only one more input from a multiplier 50 needs to be added to each PLC 60\*. For example, PLC **60\*1a receives one of multiplier outputs 120 in addition to its N inputs from resources 140. Similarly, PLC 60\*1r receives one of multiplier outputs 110 in addition to its N inputs from resources 140. Within local interconnection resources 70, the output 72 of any one of PLCs 60\*1 is programmably connectable to any one of the LE 130 inputs 80 served by those local interconnection resources by appropriately programming any appropriate one of programmable interconnections 74 (also sometimes included within generic references to PLCs). Assuming, for example, that the logic element 130 shown in FIG. 9 is the one that is generally designated to receive the least significant multiplier output bits, the multiplier output lead 120 that is connected to PLC 60\*1a may carry a least significant multiplier output bit, and the multiplier output lead 110 that is connected to PLC 60\*1r may carry another least significant multiplier output bit. Either of these bits can be routed to the logic element 130 shown in FIG. 9 by appropriately programming the FCEs associated with PLCs 60\*1a or 60\*1r and the PLCs 74 serving the outputs of those (and other) PLCs 60. Depicted logic element 130 can then deal with that signal in any of the various ways described above (e.g., output it with or without registration, or perform one binary place of MAC operation using it). Alternatively, both of these multiplier output bits can be routed to respective inputs 80 of depicted logic element 130 via appropriately programmed PLCs 60\*1a and 60\*1r and associated elements 72 and 74. Depicted logic element 130 can process these signals as described above (e.g., add them as part of a multiplier-adder operation). FIG. 9 shows again that the outputs of multipliers 50 are routed to logic elements 130 with little or no use of global interconnection resources such as 140, 150, etc. Moreover, even the impact on the routing feeding local interconnection resources 70 is relatively minor, with only one more input being added to each of selected PLCs 60**.

It will be appreciated (with continued reference to FIG. 9) that in the example in which each region 30 includes ten logic elements 130, each group of PLCs **60\*1, 60\*2, etc., that receives multiplier outputs 110/120 receives a maximum of ten outputs 110 and a maximum of ten outputs 120. Thus, for example, PLC group 60\*1 includes ten PLCs 60\*1a, 1b, 1c, etc., for respectively receiving ten multiplier outputs 120, and ten more PLCs 60\*1r, 1s, 1t, etc., for respectively receiving ten multiplier outputs 110. In this architecture, however, each PLC group 60 (including PLC groups 60\*) includes more than 20 PLCs. PLCs 60 are therefore only partially populated. Of course, if (as has already been mentioned) each region 30 has a number of logic elements 130 different than ten, then the number of PLCs 60 associated with each region 30 will tend to be increased or decreased in approximate proportion to the increase or decrease in the number of logic elements. The number of those PLCs 60\* that receive signals 110 or 120 will also increase or decrease with the increase or decrease in number of logic elements in a region, but overall will remain fewer than the total number of PLCs in each PLC group. PLCs 60** will therefore remain only partially populated.

FIGS. like FIGS. 2–5 and also FIG. 9 show how the use of logic elements 130 to receive the output signals of multipliers 50 allows the resources of those logic elements (e.g., the logic element programmable logic, registers, output drivers, and/or output routing to the general/global interconnect) to be used for the multiplier outputs, thereby avoiding the need to provide additional such resources that are dedicated to serving the multiplier outputs. Moreover, routing the multiplier outputs to and through logic elements allows the multiplier outputs to be used in any of the several modes illustrated by FIGS. 2–6 (i.e., unregistered output, registered output, multiplier-accumulator ("MAC") mode, multiplier-adder mode with or without registration, etc.). The total amount of general/global routing that is required to perform and add together the results of two multiplications is greatly reduced (e.g., by about 50%). This percentage reduction holds for performing and adding together the results of any number of multiplications.

Figure 10:
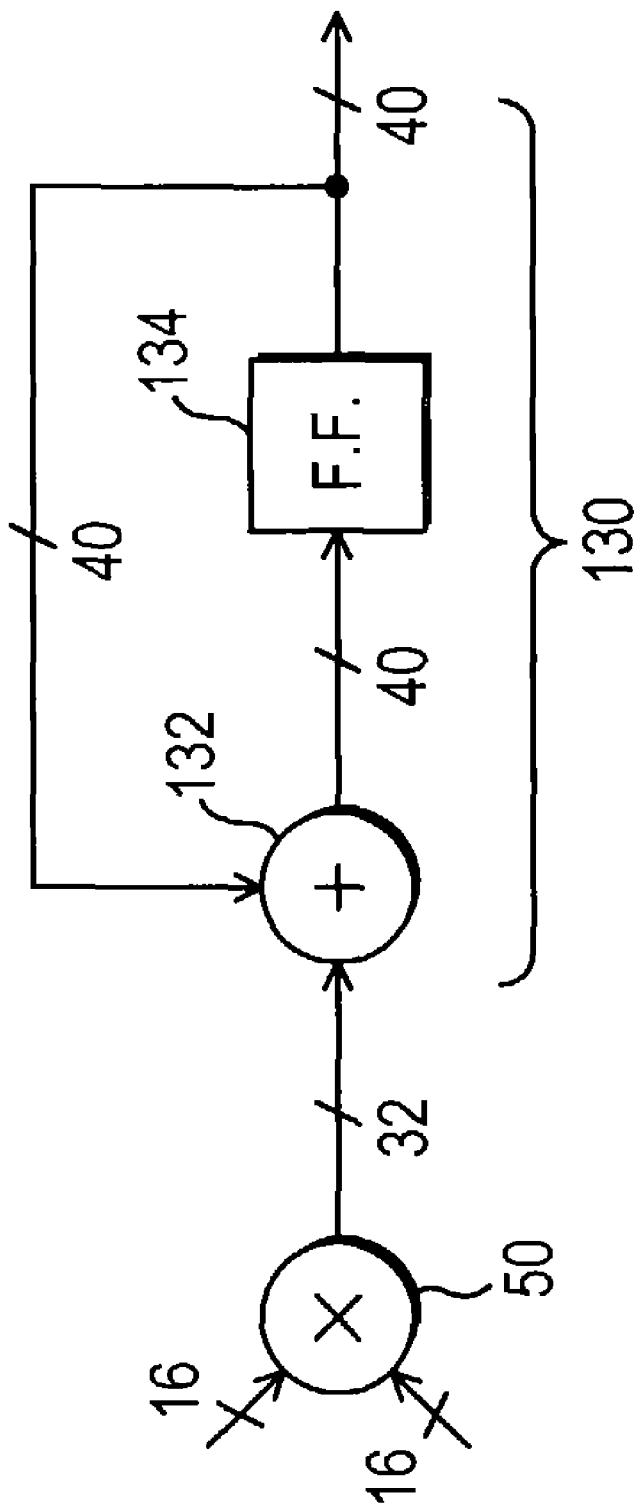
FIG. 10 is a schematic block diagram illustrating one possible configuration and use of a portion of the FIG. 1 circuitry.
Figure 11:
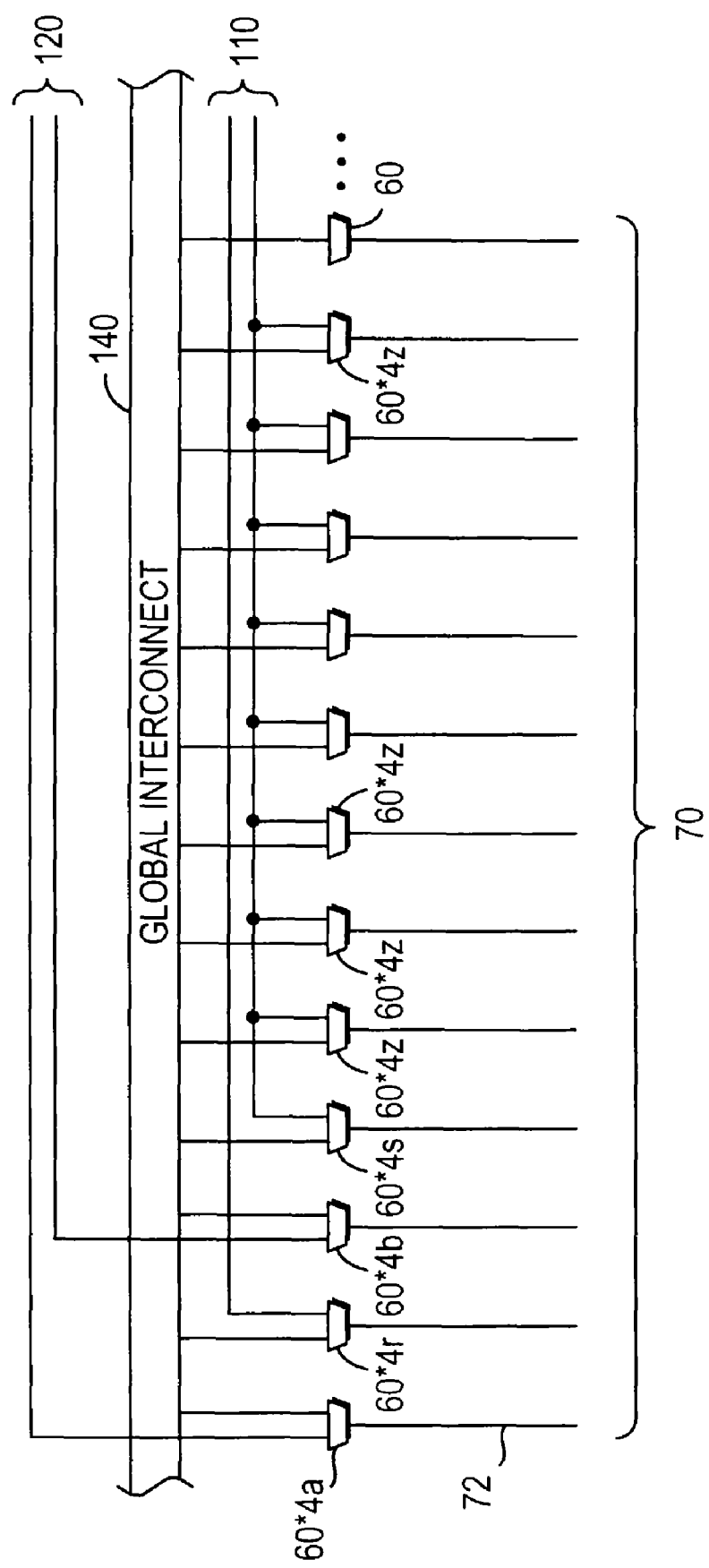
FIG. 11 is generally similar to FIG. 9 but illustrates a further possible feature of the invention.

FIGS. 10 and 11 illustrate how the circuitry of this invention can address an issue that is encountered in operations like MAC operation. FIG. 10 shows again a basic MAC structure (like FIG. 4 but with some specific examples of bus widths indicated). In particular, FIG. 10 shows that multiplier 50 may be constructed to multiply two words of up to 16 bits each to produce a product word of up to 32 bits. The adder and register portions of the MAC circuitry must have significantly greater capacity than 32 bits in order to ensure that overflow and/or underflow (generically simply "overflow") do not occur excessively frequently as a result of accumulating successive product words. Thus FIG. 10 shows the adder and register portions of the circuitry having capacity adequate to handle words of up to 40 bits.

Because two's complement arithmetic is frequently used in the intended applications of the circuitry of this invention, it is desirable to be able to extend the sign of the multiplier 50 output to the additional more-significant arithmetic places used by adder logic 132. (In two's complement arithmetic a positive number is changed to a negative number of equal absolute value by inverting all the bits of the positive number and then adding 1 (see FIG. 12). Thus the most significant bit of all positive numbers is 0, and the most significant bit of all negative numbers is 1. If word length is increased, a 0 in the initially most significant place must be "extended" to all additional places of even greater significance, and a 1 in the initially most significant place must be similarly "extended" to all additional places of even greater significance. Operations of this kind are sometimes referred to as "sign extension.")

In the example shown in FIG. 10 it is desirable to be able to automatically "sign extend" the 32-bit multiplier output prior to its application to 40-bit adder logic 132. FIG. 11 shows how this can be done in the multiplier output circuitry of this invention in accordance with a further feature of the invention. With reference to FIG. 1, FIG. 11 shows additional detail for the fourth region 30 from the left in a representative super-region 20. In accordance with earlier discussions, the two most significant outputs 120 of a multiplier 50 in another super-region 20 are respectively applied to two PLCs **60\*4a and 60\*4b. Similarly, the two most significant outputs 110 of the multiplier 50 in the same super-region 20 are respectively applied to two PLCs 60\*4r and 60\*4s. In addition, the most significant output 110 of that multiplier is applied to eight other PLCs 60\*4z to facilitate extension of the sign on that most significant lead 110 to eight even more significant places of adder logic 132 (performed by eight additional logic elements 130 in the region 30 served by the local interconnect outputs and other resources 70/72 of the depicted PLCs 60). This facilitates extension of the formerly most significant multiplier output bit on the most significant lead 110 to eight additional places of binary addition performed in the MAC. (As a possible alternative to what is shown in FIG. 11, local interconnect 70 could be programmed to apply the output of PLC 60\*4s to eight additional logic elements 130. However, the more physical solution shown in FIG. 11** may be preferred.)

Although FIG. 11 shows additional PLC **60\*4z inputs only for the most significant lead 110, it will be understood that the same thing could alternatively or additionally be done for the most significant lead 120**.

Another possible aspect of the invention relates to facilitating the provision of MAC operation having the ability to either add or subtract new multiplier inputs. The objective is to provide MAC circuitry that can perform either of the following operations:

$$MAC=MAC+\text{INPUT} \tag{1}$$

or $$MAC=MAC-\text{INPUT} \tag{2}$$

The conventional approach to handling the input subtraction alternative is to two's complement the input and add the result to the previously accumulated value. But two's complementing requires adding a 1 to the inverted input, and this takes time and may be difficult to provide for at the appropriate point in programmable logic, which may be working with words of any of many possible lengths and locations relative to the physically fixed circuit components. To amplify this last point, when a multiplication smaller than the maximum for which the PLD is designed (e.g., a 12×12 multiplication in a PLD designed for maximum 16×16 multiplication), the multiplier inputs generally occupy the most significant bits of the multiplier input bus. The result therefore occupies the most significant bits of the multiplier result bus. As a consequence, the least significant bit of the result will not start at the least significant bit of the adder. Its start location will vary, depending on the precision of the numbers to be multiplied.

To avoid these problems, one's complement (rather than two's complement) arithmetic can be used in accordance with this invention. (One's complement representation is similar to two's complement representation, except that a 1 is not added when going from a positive number to a negative number of equal absolute value (see FIG. 13).) The logic that underlies producing result (2) above using one's complement logic is as follows (where "!" denotes one's complementing the item to which it is appended as a prefix):

$$!MAC+INPUT \quad (3)$$

$$=-MAC-1+INPUT \quad (4)$$

$$!(-MAC-1+INPUT) \quad (5)$$

$$=MAC+1-INPUT-1 \quad (6)$$

$$=MAC-INPUT \quad (7)$$

Condensing lines (3)–(7) above, MAC−INPUT results from the following:

$$!(!MAC+INPUT) \quad (8)$$

Figure 14:
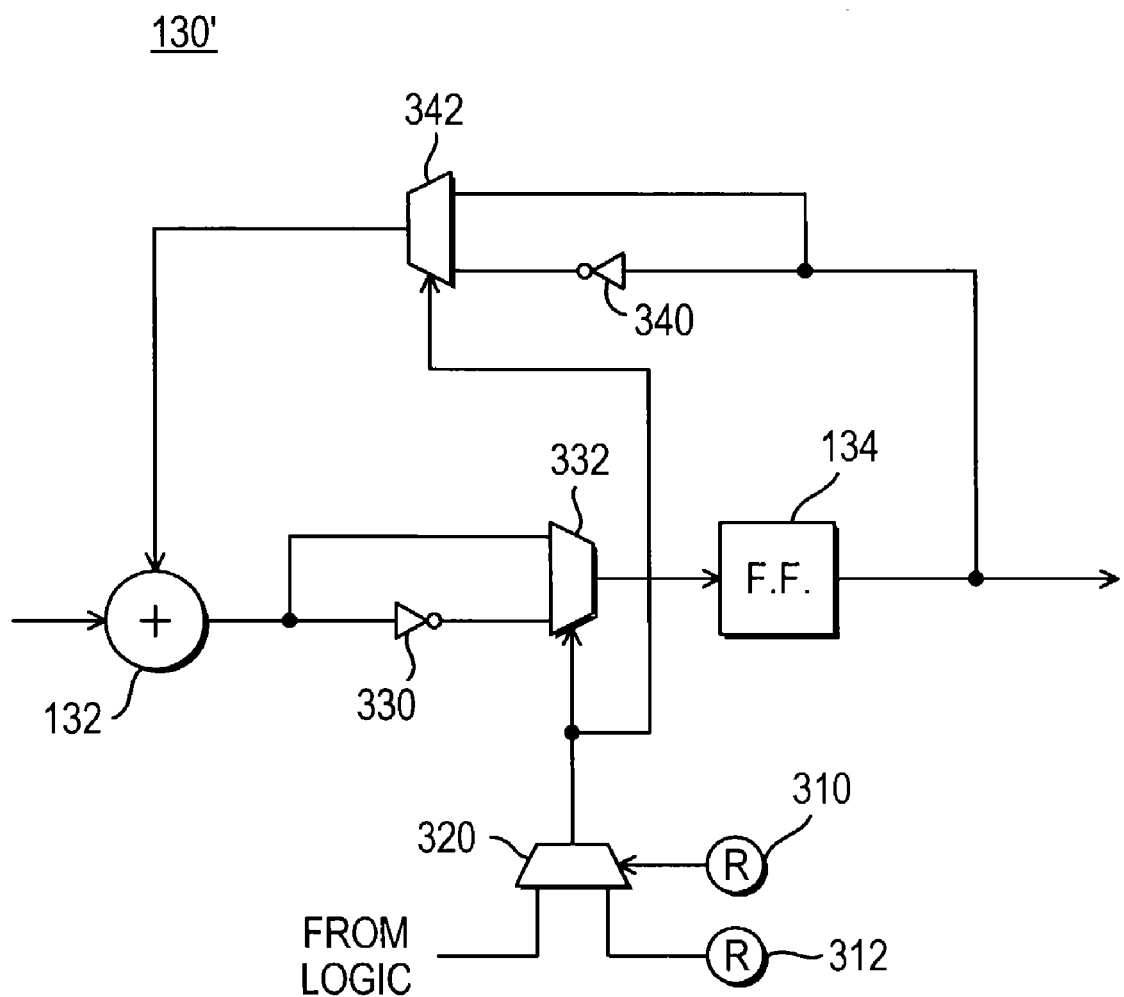
FIG. 14 is a simplified schematic block diagram of an illustrative embodiment of circuitry that may be used in accordance with the invention.

FIG. 14 shows how a representative logic module 130' can be enhanced in accordance with the invention to facilitate performing the operation represented by expression (8) above. The output of flip-flop 134 is applied to PLC 342 in both true (uninverted) and complement (inverted) form. The inverted form is produced by inverter 340. PLC 342 is controlled by the output of PLC 320 to select either of its inputs. The inputs to PLC 320 are the output of FCE 312 and a possibly dynamic signal (e.g., from elsewhere in the logic or other circuitry of device 10 (FIG. 1)). PLC 320 is controlled by FCE 310 to select either of its inputs as its output. Thus the control of PLC 342 can be either static (based on the programmed state of FCE 312) or dynamic (based on the state of the "from logic" signal).

The output signal of PLC 342 is fed back as one input to adder logic 132. The other input to the adder logic may come from a multiplier 50 as described earlier in this specification. The output of adder logic 132 is applied to PLC 332 in both true and complement form. The complement form is produced by inverter 330. PLC 332 is controlled in the same way and by the same control signal as PLC 342. Thus again, the control of PLC 332 can be either static or dynamic. Based on the control input it receives, PLC 332 selects one of its two other input signals for application to flip-flop 134 as the new accumulated value.

From the foregoing, it will be seen that logic element 130' can operate as an accumulator that either adds or subtracts its input signal. Moreover, logic element 130' can be programmed to either always add its input, always subtract its input, or add or subtract at various times-depending on the current state of the "from logic" signal in FIG. 14.

Figure 15:
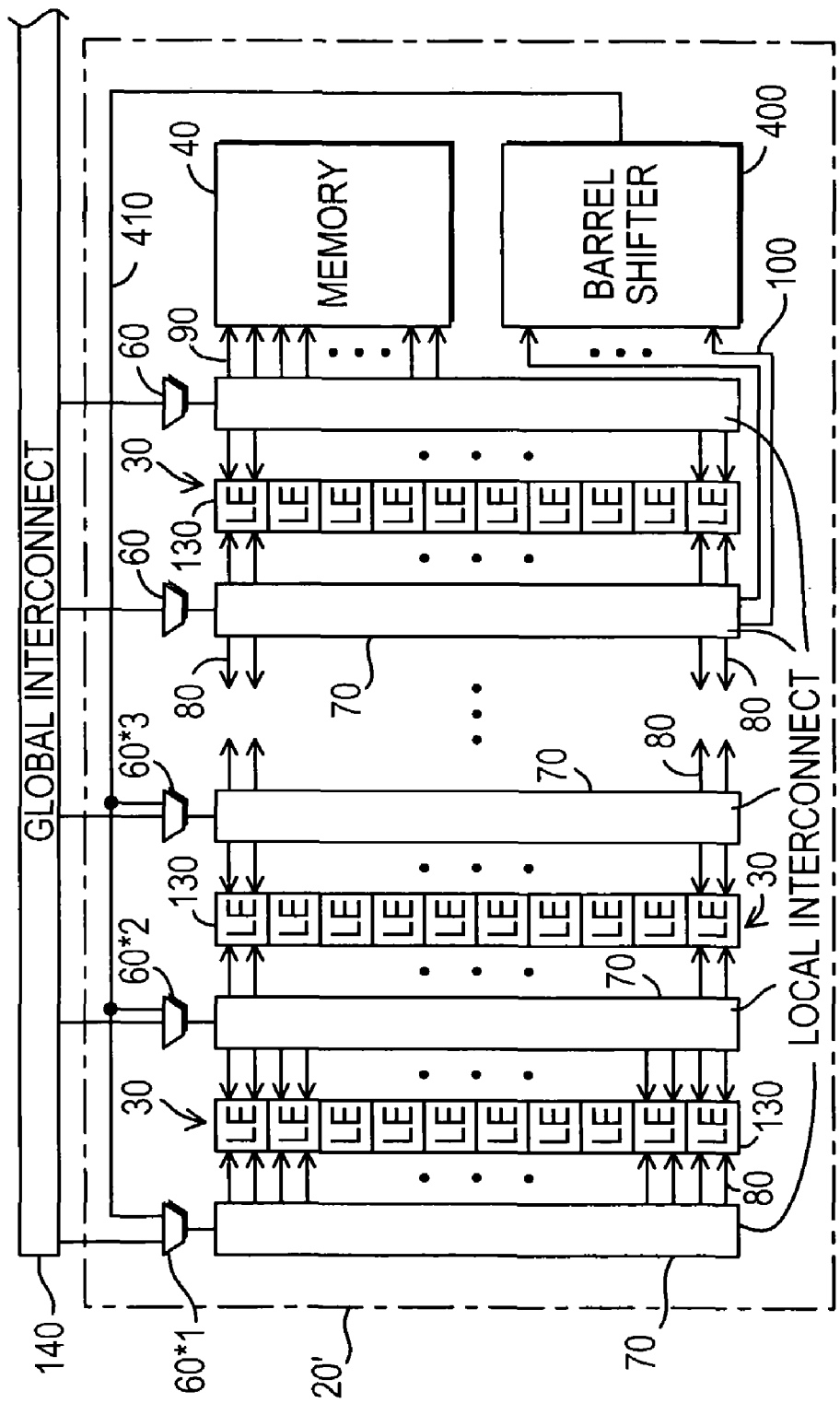
FIG. 15 is a simplified schematic block diagram of a representative portion of another illustrative embodiment of the invention.

As has already been mentioned, various features of this invention are applicable to types of FSBs other than multipliers. For example, FIG. 15 shows an illustrative super-region 20' that can be included in a PLD like PLD 10 (FIG. 1) and that includes dedicated barrel shifter circuitry 400 in place of the dedicated parallel multiplier circuitry 50 shown and described earlier. Barrel shifter circuitry 400 (which can be per se conventional) may be capable of any or all of the functions typically associated with barrel shifters. These functions generally include any of several types of shifts of the bits of a word applied to the barrel shifter in parallel. In addition, the amount (number of places) by which the bits are shifted may be selectable. For example, barrel shifter 400 may be capable of such shifts as "arithmetic shift right (or left)", "logical shift right (or left)", "rotate right (or left)", etc. It may also be desirable to register or not register the outputs of barrel shifter 400. Barrel shifter 400 has a variety of possible uses such as in digital signal processing ("DSP"), arithmetic computation, shifting bits as part of logic operations, etc.

In the illustrative embodiment shown in FIG. 15, barrel shifter 400 may have approximately 40 parallel inputs 100 (e.g., 32 bits of the word to be manipulated by the barrel shifter, two bits indicating the type of shift operation to be performed, and six bits indicating the number of places the data is to be shifted). As in the case of a multiplier 50 in FIG. 1, the inputs 100 to barrel shifter 400 preferably come (at least for the most part) from the local interconnect 70 that otherwise supplies at least some of the main inputs 80 to two regions 30 of logic. Preferably the local interconnect 70 used for this purpose is relatively close to barrel shifter 400, but is not local interconnect that supplies main inputs 90 to memory region 40. Thus (as in the case of multiplier 50) barrel shifter 400 preferably does not require its own dedicated input routing. Only relatively local routing resources, that are already provided for other purposes, are taken up when barrel shifter 400 is to be used. The input routing for barrel shifter 400 requires no significant addition to either the local or global routing resources of the PLD, and this input routing does not even impose any significant additional burden on the global routing resources that are provided. By sharing local routing 70 with selected logic regions 30, use of barrel shifter 400 does not interfere with simultaneous use of the memory region 40 in the same super-region 20' in the presently preferred embodiment. However, in an alternative embodiment a barrel shifter 400 could share local routing 70 with an associated memory region 40.

The output signals of barrel shifter 400 are preferably handled in very much the same way that the output signals of multipliers 50 in FIG. 1 are handled. In particular, dedicated, relatively local routing 410 is provided for applying the output signals of barrel shifter 400 to the local routing resources 60/70 of selected logic regions 30 in the super-region 20' that includes the barrel shifter. This routing allows the (e.g., 32) parallel output signals of barrel shifter 400 to be applied in parallel to a corresponding number of logic elements 130. These logic elements can handle the barrel shifter output signals in any of several ways. For example, the output drivers of or associated with the receiving logic elements 130 can be used to drive the barrel shifter output signals out into the more general and global routing resources (e.g., 140/150) of the device, and this can be done either with or without registration of those signals by the registers (flip flops) of or associated with the receiving logic elements. As another example, the programmable logic of the receiving logic elements 130 can be used to begin to further process the barrel shifter output signals, and then the resulting signals can be driven out via the logic element output drivers (either with or without registration by the logic element registers).

Again, this arrangement for dealing with the output signals of barrel shifter 400 has a number of advantages. For example, it avoids having to provide additional output drivers and registers that are dedicated for use by the barrel shifter. The initial use of dedicated local output routing 410 reduces the impact of barrel shifter operation on the more general and possibly global interconnection resources of the device. Feeding the barrel shifter output signals relatively directly into logic elements 130 allows any desired further processing of those signals to begin more immediately in those logic elements.

Figure 16:
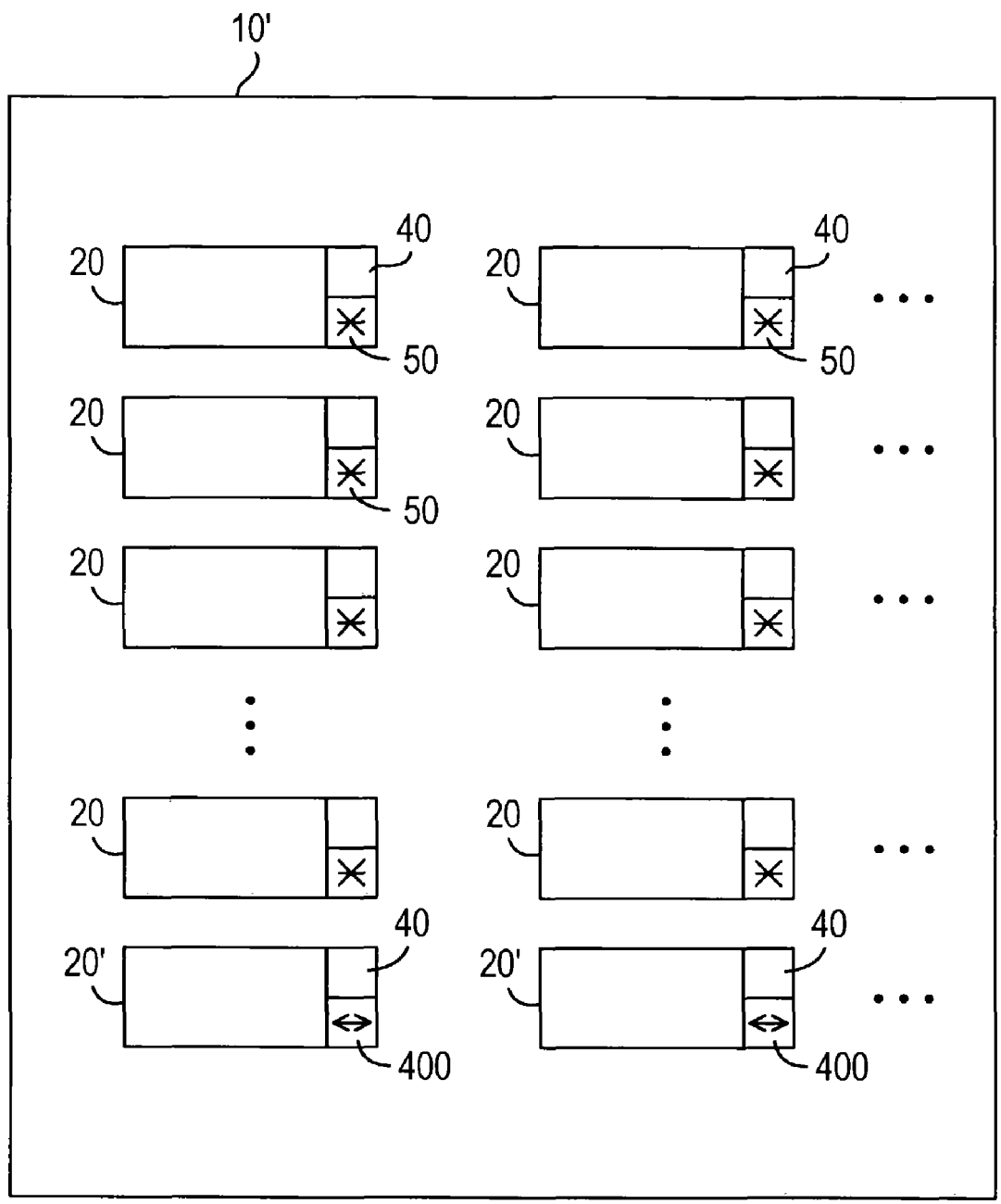
FIG. 16 is a simplified block diagram showing illustrative use of the FIG. 15 circuitry in accordance with the invention.

FIG. 16 shows an illustrative PLD 10' in accordance with the invention that includes both super-regions 20 of the type shown in more detail in FIG. 1 and super-regions 20' of the type shown in more detail in FIG. 15. In illustrative PLD 10' each column of super-regions includes several super-regions 20 having dedicated parallel multiplier circuits 50, and one super-region 20' (at the bottom of the column) having dedicated parallel barrel shifter circuitry 400. This reflects an anticipated need for more multipliers than barrel shifters, but any ratio of multipliers to barrel shifters can be implemented.

Figure 17:
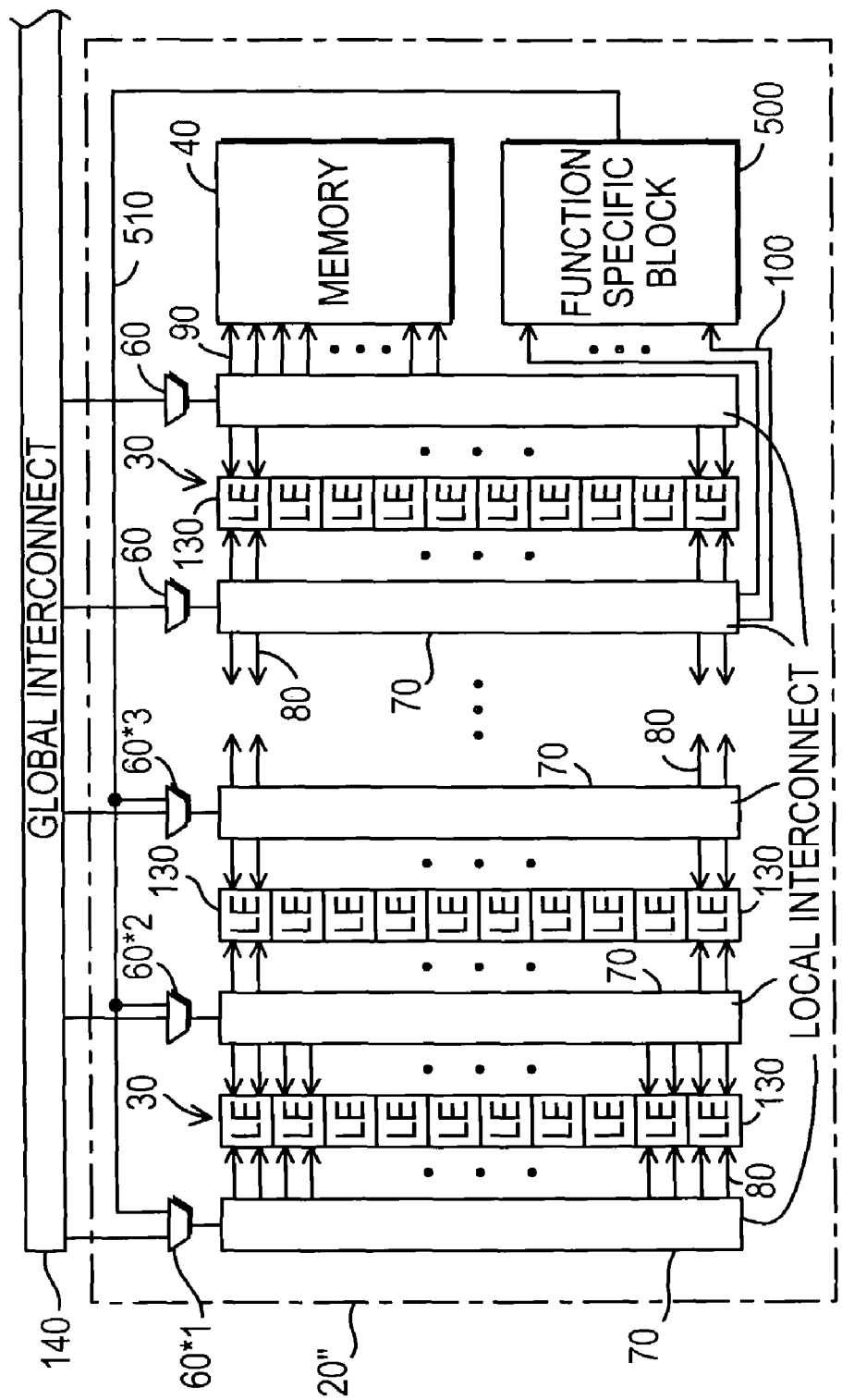
FIG. 17 is a simplified schematic block diagram of a representative portion of still another illustrative embodiment of the invention.

FIG. 17 shows how a representative portion of the illustrative circuitry shown and described earlier can be generalized to any of a wide range of function-specific blocks ("FSBs") 500. FSB 500 in FIG. 17 is located and connected in the circuitry of super-region 20" where a multiplier 50 or a barrel shifter 400 is located in other, previously described FIGS. Thus FSB 500 has input (100) and output (510) routing generally similar to the input and output routing of a previously described multiplier 50 or barrel shifter 400. Other specific examples of circuitry that FSB 500 can be are (1) a parallel arithmetic logic unit ("ALU"), (2) a parallel galois field ("GF") multiplier, and (3) small multiplier arrays used for SIMD (single instruction, multiple data) processing. Still other examples will occur to those skilled in the art.

Figure 18:
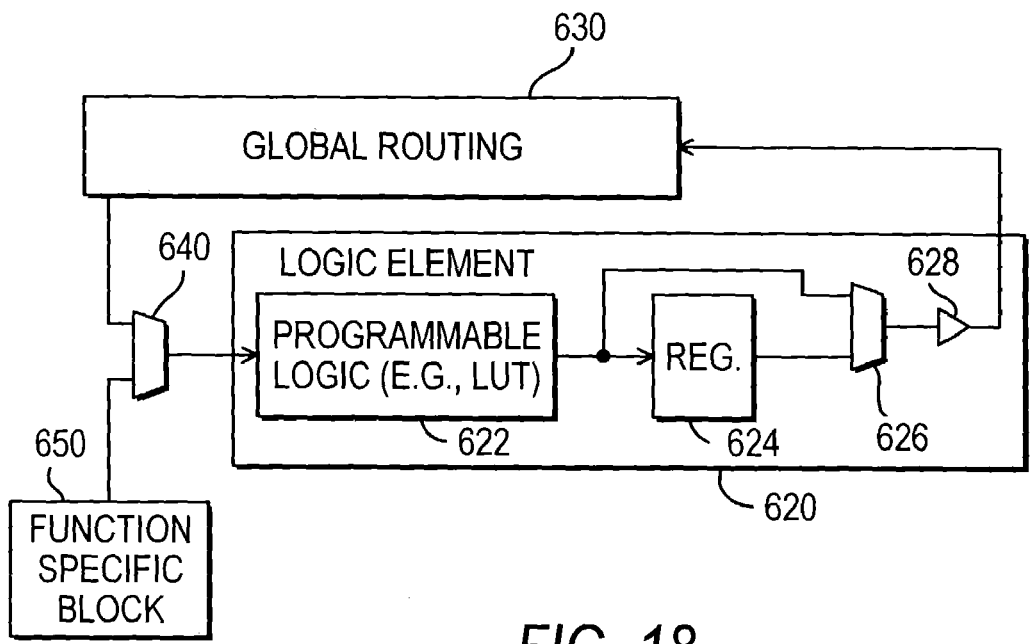
FIG. 18 is a simplified schematic block diagram generically illustrative of several possible embodiments of the invention.

FIG. 18 shows a more generalized illustration of what has been described above. A representative logic element 620 includes programmable logic (such as a programmable, four-input look-up table) 622, a register 624 for registering the output of logic 622, a PLC 626 for passing either the unregistered output of logic 622 or the output of register 624, and an output driver 628 for driving the output of PLC 626 out into global routing resources 630 of PLD 610. Logic element 620 can get its inputs (or at least some of its primary data inputs) from global routing 630 via local routing 640. Local routing 640 can be alternatively used to apply the outputs of parallel function-specific block 650 (e.g., of any of the types mentioned above) to the inputs of logic element 620. As has already been pointed out, this arrangement has such advantages as avoiding the need to provide dedicated registers and/or output drivers for FSB 650. It also avoids the need to use global routing for the immediate outputs of FSB 650.

Figure 19:
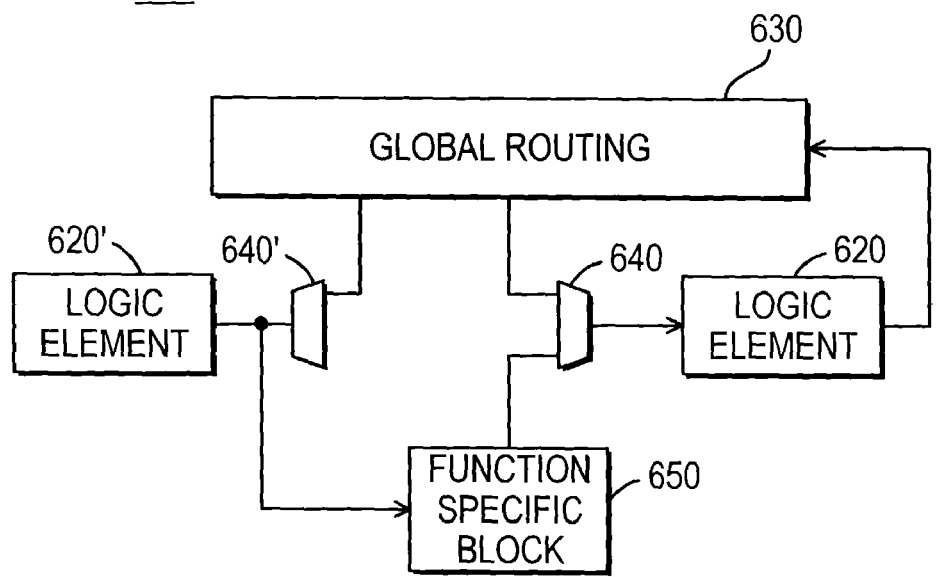
FIG. 19 is similar to FIG. 18 and generically shows additional possible features of several illustrative embodiments of the invention.

FIG. 19 repeats what is shown in FIG. 18 and adds a generalization of what is shown and described earlier for the input side of an FSB. In particular, FIG. 19 shows FSB 650 getting its input signals from local interconnection resources 640' that it shares with other logic elements 620'. This has the above-described advantages such as (1) avoiding the need to use global resources or to provide additional local resources for FSB 650 input, and (2) inherently giving FSB 650 the high degree of input routing flexibility that is already typically provided for logic elements such as 620'.

Figure 20:
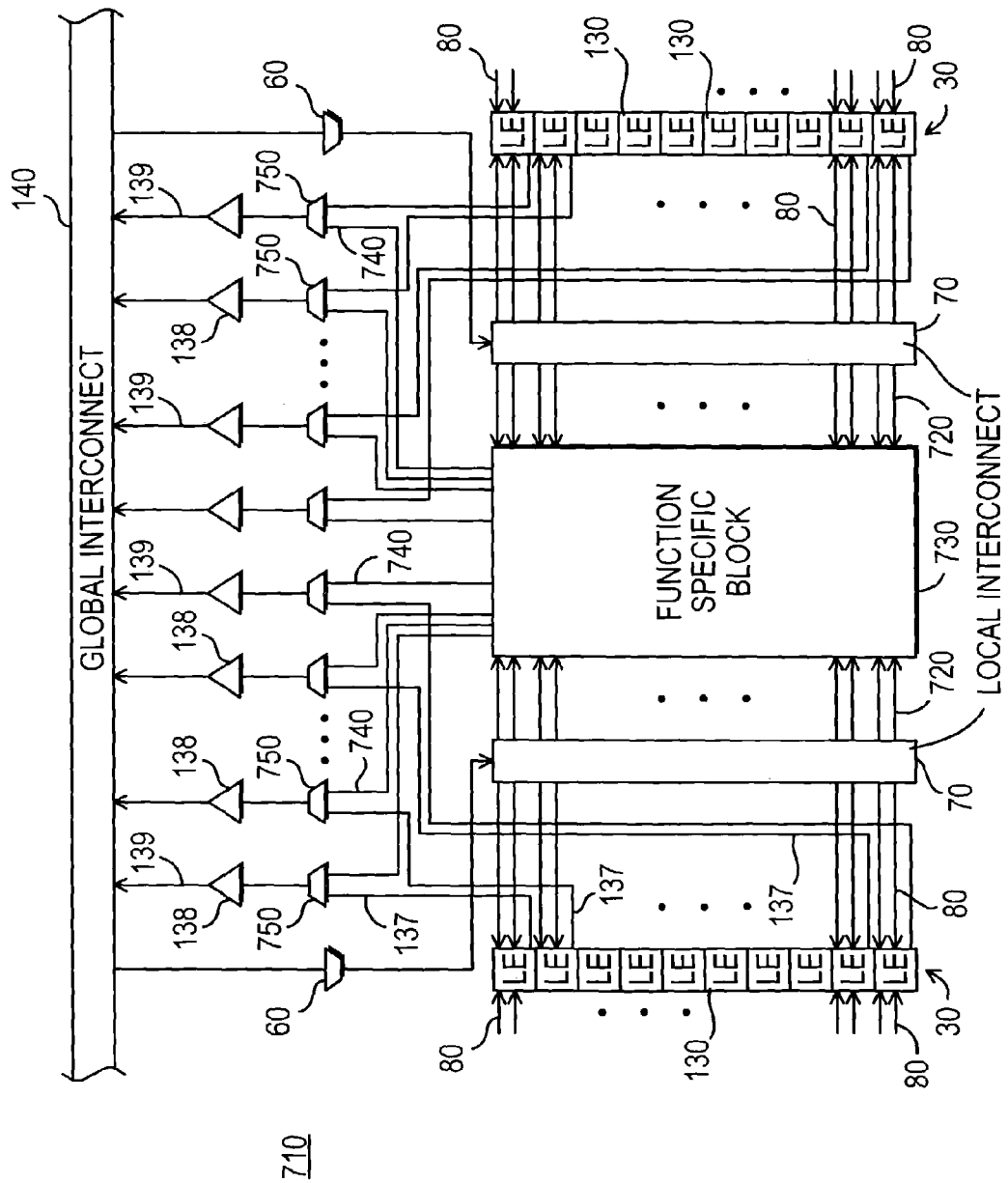
FIG. 20 is a simplified schematic block diagram of a representative portion of an illustrative embodiment of the invention.
Figure 21:
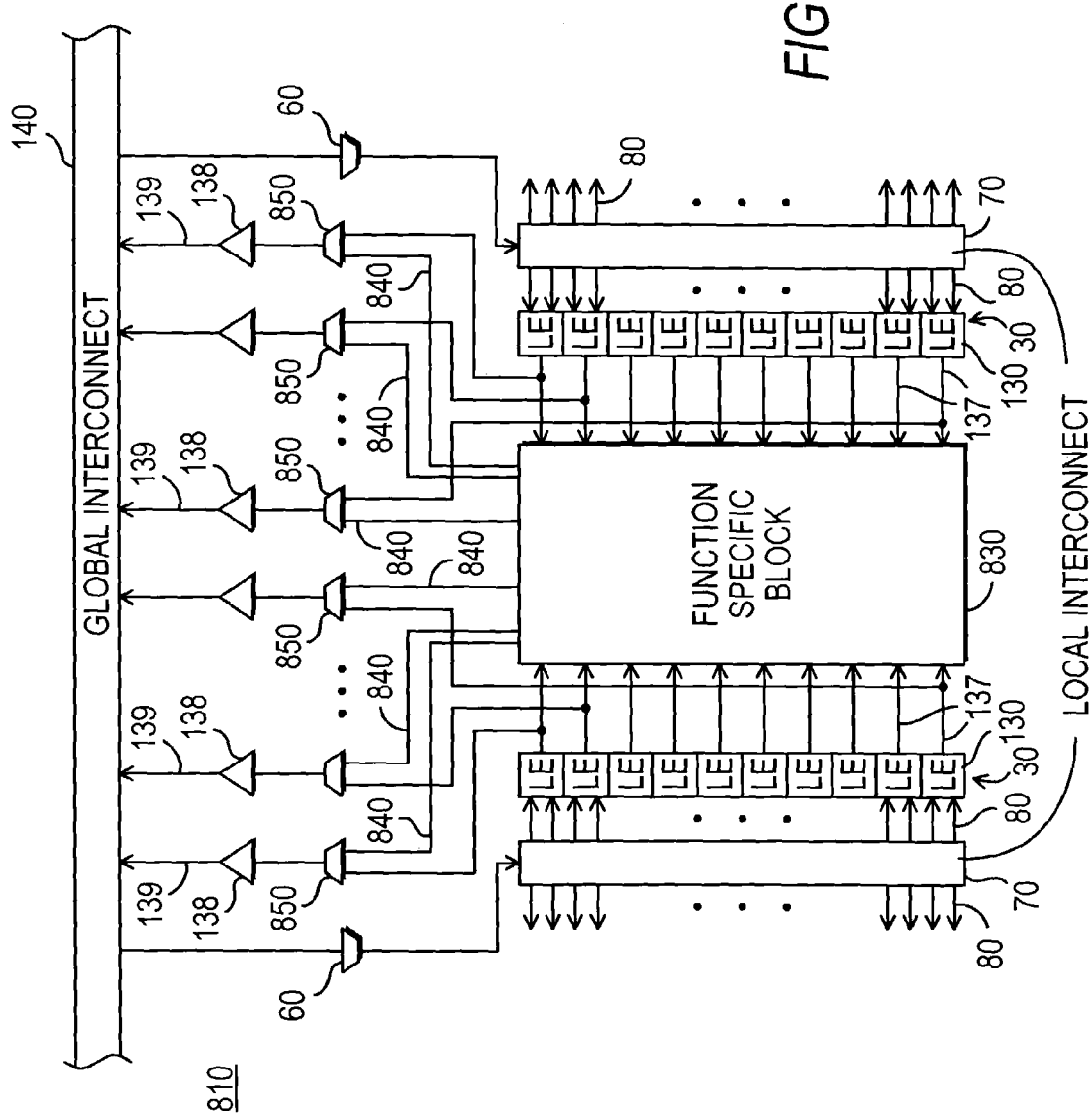
FIG. 21 is a simplified schematic block diagram of a representative portion of an illustrative embodiment of the invention.

Although the earlier-described FIGS. (other than FIGS. 18 and 19) generally show inclusion of function-specific blocks at a particular location in the illustrative PLD architecture, it will be understood that the invention is equally applicable to other PLD architectures and to other locations of FSBs in such architectures. Other modifications of the principles discussed above are also possible within the scope of the invention. FIGS. 20 and 21 show some examples of some of these variations.

In FIG. 20 FSB 730 is basically disposed between two regions 30 of programmable logic and the local interconnect 70 serving those two regions. FSB 730 gets its inputs 720 from the local interconnect 70 of those two regions 30. Accordingly, FSB 730 shares this local interconnect 70 with those regions 30 and therefore does not need its own additional, dedicated local interconnect for input. As in earlier-described embodiments, this has several advantages such as saving global interconnect, avoiding the need for additional local interconnect, and inherently giving FSB 730 the high degree of input routing flexibility that is typically provided in the input routing resources of logic regions 30.

On the output side, FSB 730 shares with the adjacent logic regions 30 the output drivers 138 of the logic elements 130 that make up those regions. To enable this to be illustrated, the output drivers 138 of the depicted logic elements 130 are shown separate from and outside the logic element boxes. The output signal 137 of the other components of each logic element is applied to one input of an associated PLC 750. One of the output signals 740 of FSB 730 is applied to another input of each PLC 750. Each PLC 750 is programmable to select either of its inputs for application to an associated output driver 138. The output 139 of each driver 138 is applied to global interconnect 140. As in the earlier-described embodiments, this sharing of output drivers 138 with logic elements 130 avoids the need to provide additional, dedicated output drivers for FSB 730. Note also that in this embodiment the output drivers 138 that are thus "stolen" for use by FSB 730 are the output drivers of the same logic elements 130 whose input interconnect 70 is also "stolen" to provide inputs to the FSB. Thus the impact of using FSB 730 is confined to a large degree to just these logic elements 130.

Still another illustrative embodiment of the invention is shown in representative portion in FIG. 21. In this embodiment FSB 830 is disposed between two programmable logic regions 30. FSB 830 gets its input signals from the circuitry of the logic elements 130 in those regions 30. For example, the signals on the lead 137 (see FIG. 6) in each of these logic elements 130 may be used as the inputs to FSB 830. Alternatively, any other signal associated with these logic elements may be used as the FSB inputs.

Each output of FSB 830 is applied to one input of a respective one of PLCs 850. Another input to each PLC 850 is a signal from a respective one of the logic elements 130 from which FSB. 830 may get an input signal. (Although FIG. 21 shows the same logic element signals 137 going to both FSB 830 inputs and PLCs 850, it will be understood that these could alternatively be different signals of the logic elements.) Each PLC 850 selects one of its input signals for application to an associated output driver 138. As in the embodiment shown in FIG. 20, drivers 138 can be the output drivers that are nominally part of the logic elements 130 from which FSB 830 may get its inputs. Drivers 138 drive the signals applied to them into global interconnect 140 as in the embodiment shown in FIG. 20.

From the foregoing it will be seen that in the embodiment shown in FIG. 21, FSB 830 shares with the adjacent logic elements 130 the output drivers 138 of those logic elements. By getting its input signals 137 directly from the adjacent logic elements 130, FSB 830 also shares with those logic elements other resources of those logic elements. For example, FSB 830 takes advantage of the input routing resources 70 and possibly also the registers 134 of those logic elements, thereby avoiding the need for additional, separate, dedicated input routing resources for FSB 830 and/or for additional, separate, dedicated input registers for the FSB.

Figure 22:
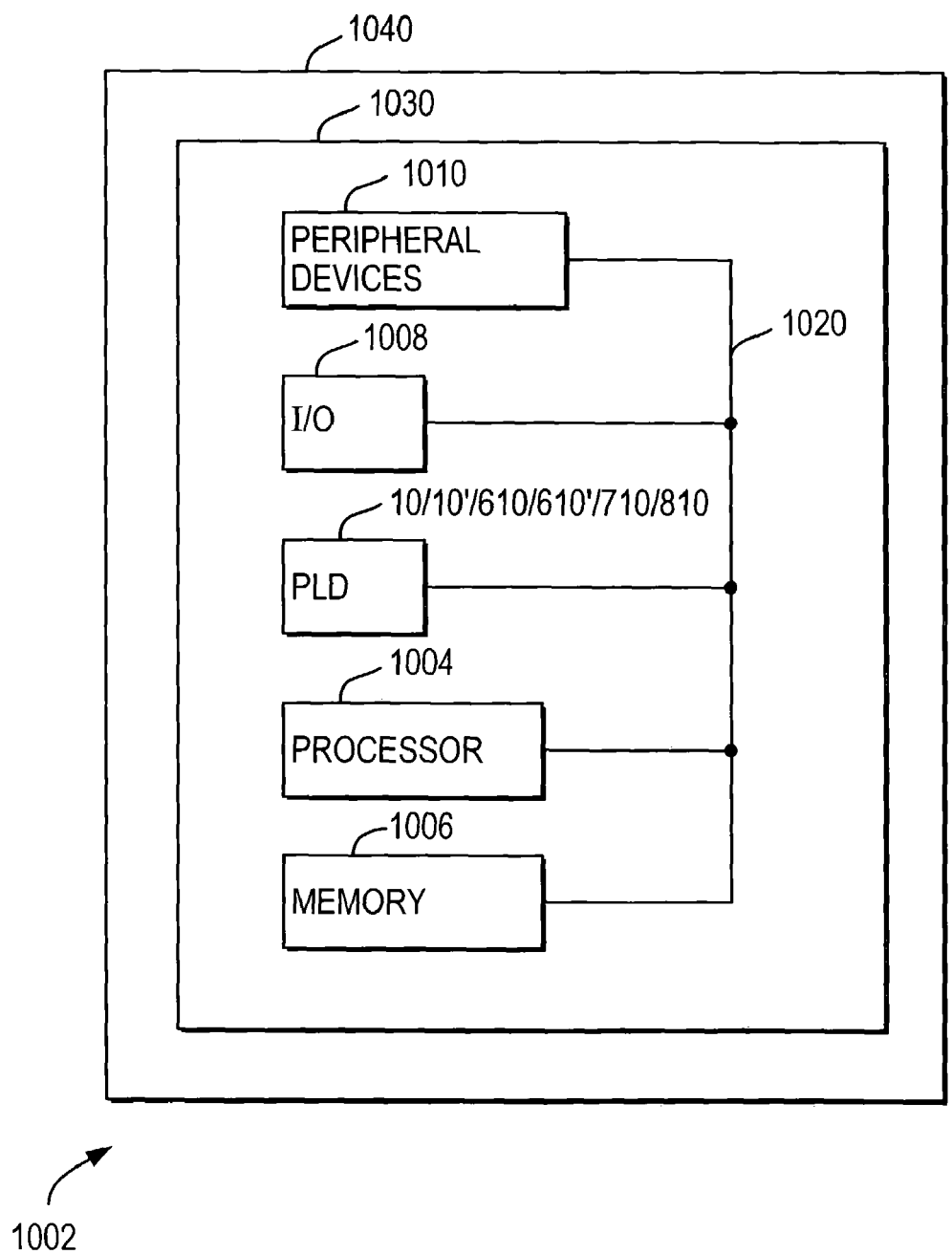
FIG. 22 is a simplified schematic block diagram of an illustrative system employing a programmable logic device in accordance with the invention.

FIG. 22 illustrates a programmable logic device 10/10'/610/610'/710/810 (hereinafter generically just 10) of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1004. Programmable logic device 10 may also be used as an arbiter for arbitrating access to a shared resource in system 1002. In yet another example, programmable logic device 10 can be configured as an interface between processor 1004 and one of the other components in system 1002. It should be noted that system 1002 is only exemplary, and that the true scope and spirit of the invention should be indicated by the following claims.

Various technologies can be used to implement programmable logic devices 10 in accordance with this invention, as well as the various components of those devices (e.g., the above-described PLCs and the FCEs that may control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the various elements of this invention can be provided on a PLD in any desired numbers and arrangements.

What is claimed is:

1. Circuitry for progressively arithmetically accumulating a succession of arithmetic values respectively represented by successive digital input signals to produce successive digital output signals respectively indicative of successive accumulated values comprising:
   first one's complement circuitry adapted to one's-complement each successive accumulated value;
   adder circuitry adapted to successively add each successive arithmetic value to concurrent outputs of the first one's complement circuitry; and
   second one's complement circuitry adapted to one's-complement outputs of the adder circuitry to produce a next successive accumulated value.

2. The circuitry defined in claim 1 further comprising:
sign extension circuitry adapted to sign-extend each successive arithmetic value.

3. The circuitry defined in claim 1 further comprising:
alternative circuitry adapted to selectively cause the first and second one's complement circuitry to pass values without one's complementing them.

4. The circuitry defined in claim 3 further comprising:
programmable circuitry adapted to control whether the alternative circuitry is operative.

5. The circuitry defined in claim 3 further comprising:
control circuitry adapted to apply a time-varying signal to the alternative circuitry so that the alternative circuitry is operative only at certain times.

* * * * *